US012655284B2

(12) United States Patent
Oh et al.

(10) Patent No.: US 12,655,284 B2
(45) Date of Patent: Jun. 16, 2026

(54) RESIN COMPOSITION, COVER WINDOW INCLUDING THE SAME, AND DISPLAY APPARATUS INCLUDING THE COVER WINDOW

(71) Applicant: Samsung Display Co., Ltd., Yongin-si (KR)

(72) Inventors: Hyunseok Oh, Yongin-si (KR); Youngdo Kim, Yongin-si (KR); Kangwoo Lee, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 991 days.

(21) Appl. No.: 17/865,741

(22) Filed: Jul. 15, 2022

(65) Prior Publication Data

US 2023/0096041 A1 Mar. 30, 2023

(30) Foreign Application Priority Data

Sep. 10, 2021 (KR) ........................ 10-2021-0121184

(51) Int. Cl.
*C08L 33/10* (2006.01)
*C09D 4/00* (2006.01)
(Continued)

(52) U.S. Cl.
CPC ................ *C08L 33/10* (2013.01); *G02B 1/04* (2013.01); *C09D 4/00* (2013.01); *H10K 59/87* (2023.02); *H10K 2102/311* (2023.02)

(58) Field of Classification Search
None
See application file for complete search history.

(56) References Cited

U.S. PATENT DOCUMENTS 5,814,680 A 9/1998 Imafuku et al.
10,020,462 B1 7/2018 Ai et al.
(Continued)

FOREIGN PATENT DOCUMENTS

CN 1175905 A 3/1998
CN 107123370 A 9/2017
(Continued)

OTHER PUBLICATIONS

English Abstract of KR 10-2018-0079093.
(Continued)

*Primary Examiner* — Randy P Gulakowski
*Assistant Examiner* — Virginia L Stonehocker
(74) *Attorney, Agent, or Firm* — CANTOR COLBURN LLP

(57) ABSTRACT

A resin composition includes a (meth)acrylate copolymer, wherein a content of a first repeat unit derived from a first monomer represented by Formula 1 in the (meth)acrylate copolymer is about 20 wt % to about 80 wt % with respect to a total amount 100 wt % of monomeric units present in the (meth)acrylate copolymer, Formula 1

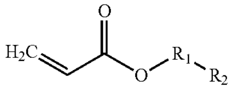

where $R_1$ a $C_1$ to $C_6$ alkylene group, $C_1$ to $C_6$ alkyl group with one or more oxygen, or an aromatic group,
$R_2$ is a $C_1$ to $C_6$ alkyl group, $C_1$ to $C_6$ alkyl group with one or more oxygen, or an aromatic group, and
at least one of $R_1$ or $R_2$ includes an aromatic group.

22 Claims, 16 Drawing Sheets

(51) Int. Cl.

| | |
|---|---|
| ***G02B 1/04*** | (2006.01) |
| ***H10K 59/80*** | (2023.01) |
| ***H10K 102/00*** | (2023.01) |

(56) References Cited

U.S. PATENT DOCUMENTS

| | | | | |
|---|---|---|---|---|
| 10,603,876 | B2 | 3/2020 | Kwak et al. | |
| 2016/0194424 | A1* | 7/2016 | Higgs | C07C 69/618 522/182 |
| 2017/0306194 | A1 | 10/2017 | Kwak et al. | |
| 2020/0342789 | A1 | 10/2020 | Park | |

FOREIGN PATENT DOCUMENTS

| | | | |
|---|---|---|---|
| CN | 107418481 | A | 12/2017 |
| CN | 112840005 | A | 5/2021 |
| KR | 10-2018-0079093 | A | 7/2018 |
| KR | 102027570 | B1 | 10/2019 |
| KR | 102040299 | B1 | 10/2019 |
| KR | 102068729 | B1 | 1/2020 |

OTHER PUBLICATIONS

English Abstract of KR 10-2040299.

Office Action issued Dec. 2, 2025, in corresponding CN Patent Application No. 202211101148.5, 10 pp.

* cited by examiner

RESIN COMPOSITION, COVER WINDOW INCLUDING THE SAME, AND DISPLAY APPARATUS INCLUDING THE COVER WINDOW

CROSS-REFERENCE TO RELATED APPLICATION

This application claims priority under 35 U.S.C. § 119 to Korean Patent Application No. 10-2021-0121184, filed on Sep. 10, 2021, in the Korean Intellectual Property Office, and all the benefits accruing therefrom, the disclosure of which in its entirety is incorporated by reference herein.

BACKGROUND

1. Field

A resin composition, a cover window including the resin composition, and a display apparatus including the cover window.

2. Description of the Related Art

Electronic apparatuses such as smart phones, digital cameras, notebook computers, navigation systems, and smart televisions that provide images to users includes a display element or apparatus for displaying images. A display apparatus includes a display panel for generating and displaying an image and a cover window arranged over the display panel to protect the display panel. Recently, display apparatuses have been used for various purposes, and as the display apparatuses have become thinner and lighter, the applicable range of the use of such displays has expanded. Recently, flexible display panels have been developed. Accordingly, the elements of a flexible display panel are formed of a relatively flexible materials such as a plastic so that the flexible display panel may be flexible.

A cover window on a flexible display panel should have flexibility while having enough hardness for protecting the flexible display panel from an external impact. Accordingly, the research and development to develop cover windows having such characteristics such as flexibility and hardness is of great interest.

SUMMARY

One or more embodiments include a cover window having impact resistance and flexibility. However, these problems are merely examples and the scope of the disclosure is not limited thereto. Additional aspects will be set forth in part in the description which follows and, in part, will be apparent from the description, or may be learned by practice of the presented embodiments.

According to one or more embodiments, a resin composition, a cover window including the resin composition, and a display apparatus including the cover window. For example, a cover window in which the visibility of trenches formed in a folding area of a cover layer included in the cover window is prevented or minimized.

According to one or more embodiments, a resin composition includes a (meth)acrylate copolymer, wherein a content of a first repeat unit derived from a first monomer represented by Formula 1 below (meth)acrylate is about 20 weight percent (wt %) to about 80 wt % with respect to a total amount, i.e., 100 wt %, of repeat (monomer) units present in the (meth)acrylate copolymer, Formula 1

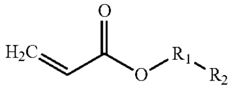

where $R_1$ is a $C_1$ to $C_6$ alkylene group, a $C_1$ to $C_6$ alkylene group with one or more oxygen atoms, or an aromatic group, and $R_2$ is a $C_1$ to $C_6$ alkyl group, a $C_1$ to $C_6$ alkyl group substituted with one or more oxygen atoms, or an aromatic group, and at least one of $R_1$ or $R_2$ includes an aromatic group.

In the present embodiments, $R_1$ includes an optionally substituted phenyl or phenylene or $R_2$ may include an optionally substituted phenyl.

In the present embodiments, a content of a second repeat unit derived from a second monomer represented by Formula 2 in the (meth)acrylate copolymer may be about 20 wt % to about 80 wt % with respect to a total weight of repeat units present in the (meth)acrylate copolymer, Formula 2

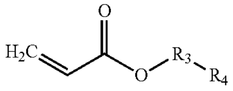

where $R_3$ is a $C_1$ to $C_6$ alkyl group or a $C_1$ to $C_6$ alkylene group with one or more oxygen atoms, and $R_4$ is a $C_1$ to $C_6$ alkyl group or $C_1$ to a $C_6$ alkyl group with one or more oxygen atoms.

In the present embodiments, the resin composition may further include a crosslinker and/or a photoinitiator.

In the present embodiments, a content of the crosslinker may be about 10 wt % to about 40 wt % (or about 10 parts to about 40 parts) with respect to a total weight (100 wt % or 100 parts) of monomer units of the (meth)acrylate copolymer.

In the present embodiments, the crosslinker may include 1,6-hexanediol diacrylate, ethylene glycol diacrylate, or any combination thereof.

In the present embodiments, a glass transition temperature Tg of the resin composition may be about −20° C. or less.

According to one or more embodiments, a cover window includes a cover layer including a first non-folding area, a second non-folding area, and a folding area and having trenches, and a resin layer arranged under the cover layer and within, including a filling of, the trenches, wherein the resin layer includes a resin composition including a (meth) acrylate copolymer, and a content of a first repeat unit derived from a first monomer represented by Formula 1 in the (meth)acrylate copolymer is about 20 wt % to about 80 wt % with respect to a total amount 100 wt % of monomeric units present in the (meth)acrylate copolymer, Formula 1

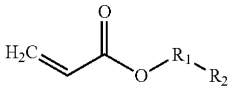

where $R_1$ is a $C_1$ to $C_6$ alkylene group, a $C_1$ to $C_6$ alkylene group with one or more oxygen atoms, or an aromatic group, $R_2$ is a $C_1$ to $C_6$ alkyl group, a $C_1$ to $C_6$ alkyl group with one or more oxygen atoms, or an aromatic group, and at least one of $R_1$ or $R_2$ includes an aromatic group.

In the present embodiments, $R_1$ may include an optionally substituted phenyl or phenylene, or $R_2$ may include an optionally substituted phenyl group.

In the present embodiments, a content of a second repeat unit derived from a second monomer represented by Formula 2 below in the (meth)acrylate copolymer may be about 20 wt % to about 80 wt % with respect to a total amount 100 wt % of a repeat unit constituting the (meth)acrylate copolymer, Formula 2

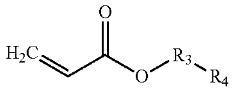

where $R_3$ is a $C_1$ to $C_6$ alkylene group or $C_1$ to $C_6$ alkylene group with one or more oxygen atoms, and $R_4$ is a $C_1$ to $C_6$ alkyl group or $C_1$ to $C_6$ alkyl group with one or more oxygen atoms.

In the present embodiments, the resin composition may further include a crosslinker and a photoinitiator.

In the present embodiments, a content of the crosslinker may be about 10 wt % to about 40 wt % with respect to the total amount of monomeric units (100 wt %) present in the (meth)acrylate copolymer.

In the present embodiments, the crosslinker may include 1,6-hexanediol diacrylate, ethylene glycol diacrylate, or any combination thereof.

In the present embodiments, the cover layer may have a first refractive index with respect to a first wavelength, the resin layer may have a second refractive index with respect to the first wavelength, and an absolute value of a difference between the first refractive index and the second refractive index may be 0.03 or less.

In the present embodiments, a modulus of the resin layer at about −20° C. may be about 0.1 MPa to about 1.0 MPa.

In the present embodiments, a glass transition temperature Tg of the resin layer may be about −20° C. or less.

In the present embodiments, an elongation of the resin layer may be 210% or more.

In the present embodiments, an adhesion of the resin layer at room temperature may be 960 gf/inch or more.

In the present embodiments, a geometric shape of each of the trenches in a vertical cross-sectional view may be a tetragon, a triangle, a semicircle, or an ellipse.

In the present embodiments, the trenches may be located within the folding area.

In the present embodiments, the folding area may include a first folding area, a second folding area, and a third folding area, the cover layer may include first trenches, second trenches, and third trenches, the first trenches may be located within the first folding area, the second trenches may be located within the second folding area, and the third trenches may be located within the third folding area.

In the present embodiments, the cover layer may further include a first cover layer and a second cover layer arranged over the first cover layer, and the resin layer may further include a first resin layer arranged between the first cover layer and the second cover layer and a second resin layer arranged over the second cover layer.

In the present embodiments, when the first trenches may be located over the second cover layer, at least one of the second trenches or the third trenches may be located over the first cover layer.

According to one or more embodiments, a display apparatus includes a display panel including a pixel, and a cover window including a cover layer arranged over the display panel, including a first non-folding area, a second non-folding area, and a folding area, and having trenches, and a resin layer arranged under the cover layer and filling the trenches, wherein the resin layer includes a resin composition including a (meth)acrylate copolymer, and a content of a first repeat unit derived from a first monomer represented by Formula 1 in the (meth)acrylate copolymer is about 20 wt % to about 80 wt % with respect to a total amount 100 wt % of monomeric units present in the (meth)acrylate copolymer, Formula 1

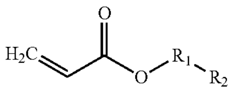

where $R_1$ is a $C_1$ to $C_6$ alkylene group, $C_1$ to $C_6$ alkylene group with one or more oxygen atoms, or an aromatic group, $R_2$ is a $C_1$ to $C_6$ alkyl group, $C_1$ to $C_6$ alkyl group with one or more oxygen atoms, or an aromatic group, and at least one of $R_1$ or $R_2$ includes an aromatic group.

In the present embodiments, $R_1$ includes an optionally substituted phenyl or phenylene, or $R_2$ may include an optionally substituted phenyl.

In the present embodiments, a content of a second repeat unit derived from a second monomer represented by Formula 2 in the (meth)acrylate copolymer may be about 20 wt % to about 80 wt % with respect to a total amount 100 wt % of monomeric units present in the (meth)acrylate copolymer, Formula 2

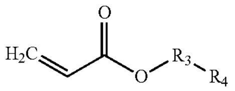

where $R_3$ is a $C_1$ to $C_6$ alkylene group or $C_1$ to $C_6$ alkylene group with one or more oxygen atoms, and $R_4$ is a $C_1$ to $C_6$ alkyl group or a $C_1$ to $C_6$ alkyl group with one or more oxygen atoms.

In the present embodiments, the resin composition may further include a crosslinker and/or a photoinitiator.

In the present embodiments, a content of the crosslinker unit may be about 10 wt % to about 40 wt % with respect to the total amount (100 wt %) of the monomeric units present in (meth)acrylate copolymer.

In the present embodiments, the crosslinker unit may be derived from 1,6-hexanediol diacrylate, ethylene glycol diacrylate, or any combination thereof.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
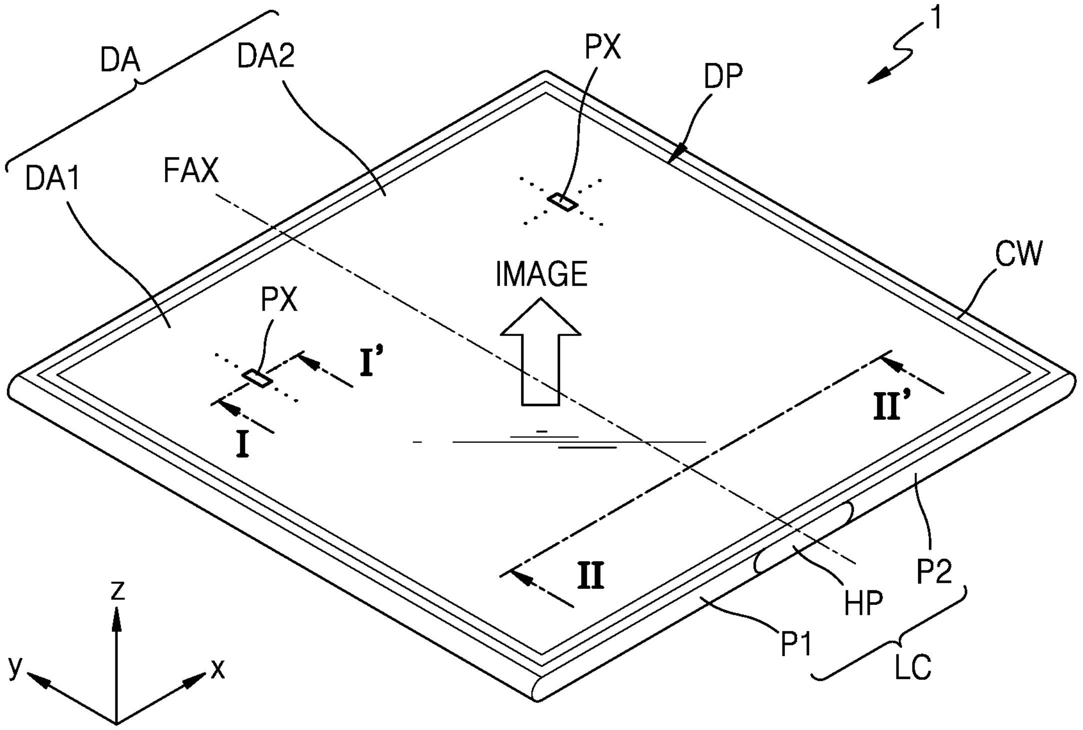
FIGS. 1 and 2 are perspective views schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. Also, the term, "A and/or B" represents the case of A, B, or A and B. Also, "at least one of A and B" represents the case of A, B, or A and B.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer or section from another element, component, region, layer or section. Thus, "a first element," "component," "region," "layer," or "section" discussed below could be termed a second element, component, region, layer, or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It will be understood that when a layer, region, area, component, or element is referred to as being "on" another layer, region, area, component, or element, it may be "directly on" the other layer, region, area, component, or element or may be "indirectly on" the other layer, region, area, component, or element with one or more intervening layers, regions, areas, components, or elements therebetween. Sizes of elements in the drawings may be exaggerated for convenience of description. In other words, because the sizes and thicknesses of elements in the drawings are arbitrarily illustrated for convenience of description, the disclosure is not limited thereto.

In the following embodiments, the meaning of a line "extending in a first direction or a second direction" may include not only extending in a linear shape but also extending in a zigzag or curved shape along the first direction or the second direction.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure.

In the following embodiments, when referred to as "in a plan view," it may mean that a target portion is viewed from above, and when referred to as "in a cross-sectional view," it may mean that a cross-section of a target portion vertically cut is viewed from side. In the following embodiments, when referred to as "overlapping," it may include overlapping "in a plan view" and overlapping "in a cross-sectional view."

The term "total amount 100 wt % of monomeric units present in the (meth)acrylate copolymer" is the total weight of the (meth)acrylate copolymer that is derived from the monomers used in the preparation of the copolymer (as representive of a repeat unit). The weight of any portion of the copolymer derived from a crosslinker or a polymerization imitator is not included in the calculation of total amount 100 wt % of monomeric units of the (meth}acrylate copolymer.

The term "$C_1$ to $C_6$ alkylene group" includes a straight or branched alkylene group with one to six carbon atoms each of which is optionally substituted with one or more substituents where any carbons present in the substituent is not included in the one to six carbons of the $C_1$ to $C_6$ alkylene group.

As used herein, unless otherwise specified, "substituted" refers to substitution of a hydrogen with an alkyl group, an alkoxy group, cycloalkyl group, a carboxyl group (—COOH), an ester group (—COOR), an amino group, an alkylthio group, a thiol group (—SH), or a cyano group (—CN). Also, optionally the substituents are not same as the groups being substituted. For example, an alkyl group is not substituted with an alkyl group.

Figure 2:
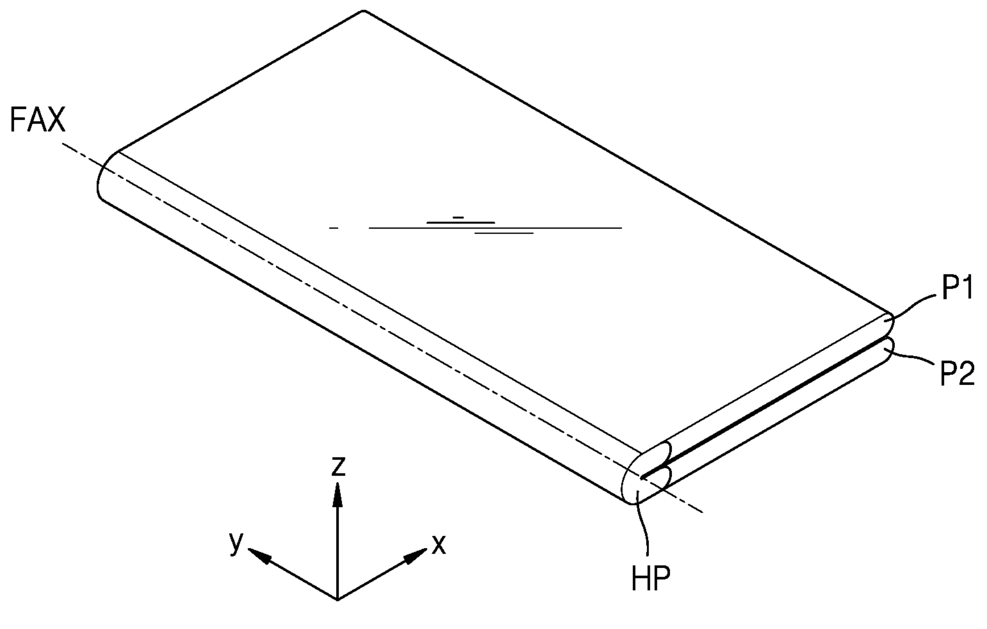

FIGS. 1 and 2 are perspective views schematically illustrating a display apparatus according to an embodiment. FIG. 1 illustrates a state in which a display apparatus 1 is unfolded, and FIG. 2 illustrates a state in which the display apparatus 1 is folded.

Referring to FIGS. 1 and 2, the display apparatus 1 may include a lower cover LC, a display panel DP, and a cover window CW.

The lower cover LC may include a first portion P1 and a second portion P2 supporting the display panel DP. The lower cover LC may be folded around a folding axis FAX defined between the first portion P1 and the second portion P2. In an embodiment, the lower cover LC may further include a hinge portion HP, and the hinge portion HP may be provided between the first portion P1 and the second portion P2.

The display panel DP may include a display area DA. The display panel DP may provide an image through an array of a plurality of pixels PX arranged in the display area DA. Each pixel PX may be defined as an emission area in which light is emitted by a light emitting element electrically connected to a pixel circuit. The light emitting element may be, for example, an organic light emitting diode (OLED). Each pixel PX may emit red, green, or blue light. Alternatively, each pixel PX may emit red, green, blue, or white light.

The display area DA may include a first display area DA1 and a second display area DA2 arranged on both sides of the folding axis FAX intersecting the display area DA. The first display area DA1 and the second display area DA2 may be respectively located over the first portion P1 and the second portion P2 of the lower cover LC. The display panel DP may provide a first image and a second image by using light emitted from the plurality of pixels PX arranged in the first display area DA1 and the second display area DA2. In an embodiment, the first image and the second image may be portions of any one image provided through the display area DA of the display panel DP. Alternatively, in an embodiment, the display panel DP may provide a first image and a second image independent of each other.

The display panel DP may be folded around the folding axis FAX. When the display panel DP is folded, the first display area DA1 and the second display area DA2 of the display panel DP may face each other.

In an embodiment, the display panel DP may be in-folded or out-folded with respect to the folding axis FAX. Here, in-folding may mean that the display panel DP is folded in the +z direction with respect to the folding axis FAX, and out-folding may mean that the display panel DP is folded in the −z direction with respect to the folding axis FAX. In other words, in-folding may mean that the upper surface of the cover window CW is folded to face each other, and out-folding may mean that the lower surface of the cover window CW is folded to face each other. In this case, the lower surface of the cover window CW may refer to a surface that is nearer to a substrate 10 (see FIG. 3) in the z direction than the upper surface of the cover window CW.

FIGS. 1 and 2 illustrate a case where the folding axis FAX extends in the y direction; however, the disclosure is not limited thereto. In an embodiment, the folding axis FAX may extend in the x direction intersecting with the y direction. Alternatively, on the xy plane, the folding axis FAX may also extend in a direction intersecting with the x direction and the y direction.

Also, FIGS. 1 and 2 illustrate a case where there is one folding axis FAX; however, the disclosure is not limited thereto. In an embodiment, the display panel DP may be folded with respect to two folding axes FAX intersecting the display area DA. For example, when the display panel DP is folded with respect to two folding axes FAX, the display panel DP may be in-folded with respect to one folding axis FAX and may be out-folded with respect to the other folding axis FAX. Alternatively, the display panel DP may be in-folded or out-folded with respect to both of two folding axes FAX. However, the disclosure is not limited thereto. In an embodiment, the display panel DP may be folded with respect to a plurality of folding axes FAX intersecting the display area DA. In this case, the display panel DP may be in-folded or out-folded with respect to each folding axis FAX.

The cover window CW may be arranged over the display panel DP and may cover the display panel DP. The cover window CW may be folded or bent according to an external force without occurrence of a crack or the like. When the display panel DP is folded around the folding axis FAX, the cover window CW may also be folded and may cover the display panel DP.

Figure 3:
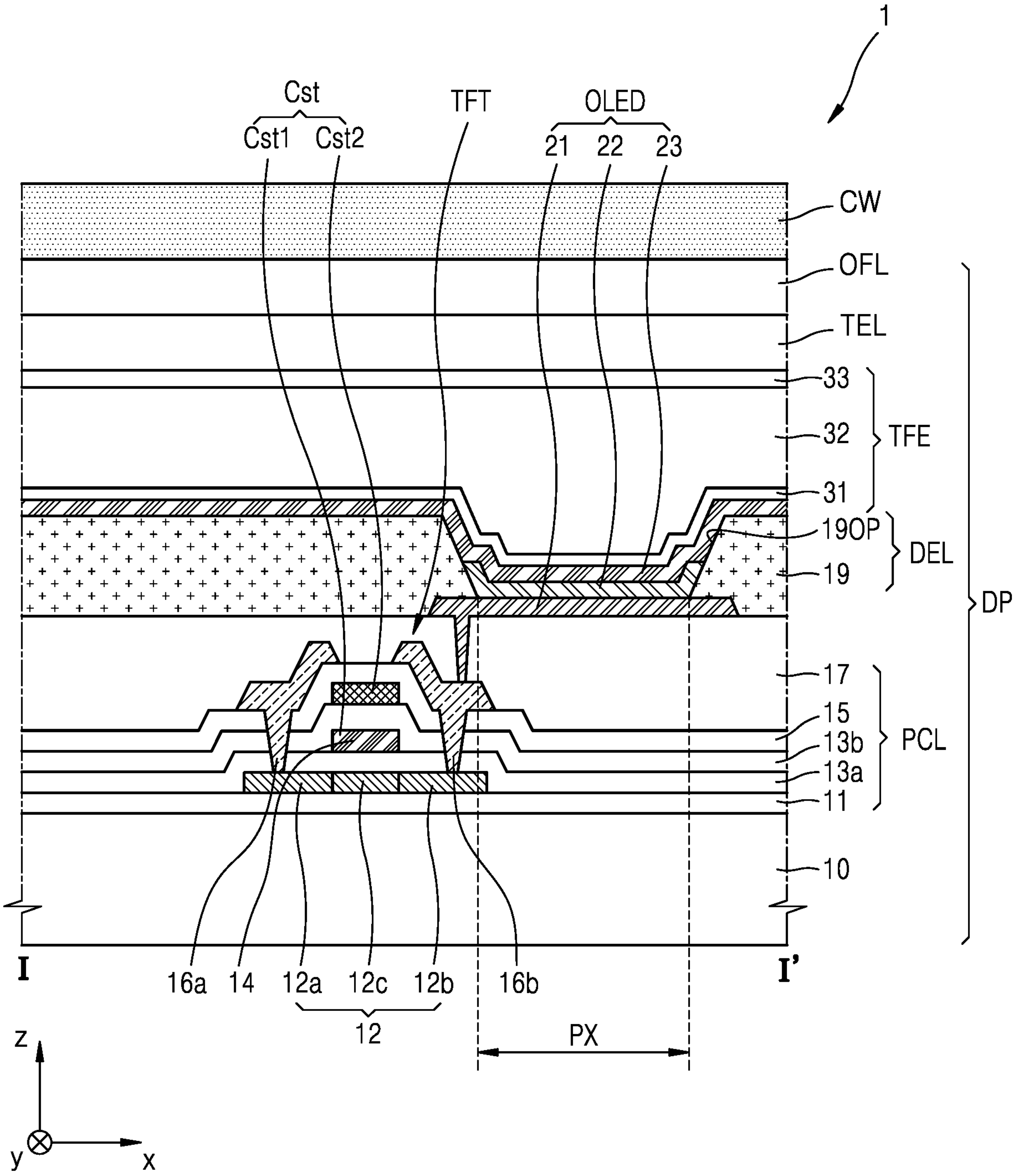
FIG. 3 is a cross-sectional view schematically illustrating a portion of a display apparatus according to an embodiment.

FIG. 3 is a cross-sectional view schematically illustrating a portion of a display apparatus according to an embodiment. FIG. 3 may correspond to a cross-section taken along line I-I' of FIG. 1.

Referring to FIG. 3, the display panel DP may include a stack structure of a substrate 10, a pixel circuit layer PCL, a display element layer DEL, a thin film encapsulation layer TFE, a touch electrode layer TEL, and an optical functional layer OFL.

The substrate 10 may include glass or polymer resin. In this case, the polymer resin may include at least one of polyether sulfone, polyarylate, polyether imide, polyethylene naphthalate, polyethylene terephthalate, polyphenylene sulfide, polyimide, polycarbonate, cellulose triacetate, and cellulose acetate propionate.

The pixel circuit layer PCL may be arranged over the substrate 10. FIG. 3 illustrates that the pixel circuit layer PCL includes a thin film transistor TFT, and a buffer layer 11, a first insulating layer **13*a*, a second insulating layer 13*b*, a third insulating layer 15, and a planarization layer 17** that are arranged under and/or over elements of the thin film transistor TFT.

The buffer layer 11 may reduce or block the penetration of foreign materials, moisture, or external air from under the substrate 10 and may provide a flat surface on the substrate 10. The buffer layer 11 may include an inorganic insulating material such as silicon nitride, silicon oxynitride, and silicon oxide and may include a single layer or multiple layers including the inorganic insulating material.

The thin film transistor TFT over the buffer layer 11 may include a semiconductor layer 12, and the semiconductor layer 12 may include polysilicon. Alternatively, the semiconductor layer 12 may include amorphous silicon, may include an oxide semiconductor, or may include an organic semiconductor or the like. The semiconductor layer 12 may include a channel area **12*c* and a drain area 12*a* and a source area 12*b* arranged on both sides of the channel area 12*c* respectively. A gate electrode 14 may overlap the channel area 12*c***.

The gate electrode 14 may include a low-resistance metal material. The gate electrode 14 may include a conductive material including molybdenum (Mo), aluminum (Al), copper (Cu), titanium (Ti), or the like and may include a single layer or multiple layers including the above material.

The first insulating layer 13*a* may be located between the semiconductor layer 12 and the gate electrode 14. The first insulating layer 13*a* may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). In this case, zinc oxide ($ZnO_x$) may include zinc oxide (ZnO) and/or zinc peroxide ($ZnO_2$).

The second insulating layer 13*b* may be provided to cover the gate electrode 14. The second insulating layer 13*b* may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). In this case, zinc oxide ($ZnO_x$) may include zinc oxide (ZnO) and/or zinc peroxide ($ZnO_2$).

An upper electrode Cst2 of a storage capacitor Cst may be arranged over the second insulating layer 13*b*. The upper electrode Cst2 may at least partially overlap the gate electrode 14 arranged thereunder. The gate electrode 14 and the upper electrode Cst2 overlapping each other with the second insulating layer 13*b* therebetween may form the storage capacitor Cst. That is, the gate electrode 14 may function as a lower electrode Cst1 of the storage capacitor Cst.

As such, the storage capacitor Cst and the thin film transistor TFT may be formed to overlap each other. Alternatively, in an embodiment, the storage capacitor Cst may not overlap the thin film transistor TFT. That is, as a separate element from the gate electrode 14, the lower electrode Cst1 of the storage capacitor Cst may be formed apart from the gate electrode 14.

The upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or multiple layers of the above material.

The third insulating layer 15 may cover the upper electrode Cst2. The third insulating layer 15 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). In this case, zinc oxide ($ZnO_x$) may include zinc oxide (ZnO) and/or zinc peroxide ($ZnO_2$). The third insulating layer 15 may include a single layer or multiple layers including the above inorganic insulating material.

Each of a drain electrode 16*a* and a source electrode 16*b* may be located over the third insulating layer 15. The drain electrode 16*a* and the source electrode 16*b* may be respectively connected to the drain area 12*a* and the source area 12*b* through contact holes of insulating layers thereunder. The drain electrode 16*a* and the source electrode 16*b* may include a material having high conductivity. The drain electrode 16*a* and the source electrode 16*b* may include a conductive material including molybdenum (Mo), aluminum (Al), copper (Cu), titanium (Ti), or the like and may include a single layer or multiple layers. In an embodiment, the drain electrode 16*a* and the source electrode 16*b* may have a multilayer structure of Ti/Al/Ti.

The planarization layer 17 may include an organic insulating material. The planarization layer 17 may include an organic insulating material such as a general-purpose polymer such as polymethylmethacrylate (PMMA) or polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof.

The display element layer DEL may be arranged over the pixel circuit layer PCL having the above structure. The display element layer DEL may include an organic light emitting diode OLED as a light emitting element, and the organic light emitting diode OLED may include a stack structure of a pixel electrode 21, an emission layer 22, and a common electrode 23. The pixel electrode 21 of the organic light emitting diode OLED may be electrically connected to the thin film transistor TFT through a contact hole defined in the planarization layer 17.

The pixel electrode 21 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 21 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. Alternatively, in an embodiment, the pixel electrode 21 may further include a layer formed of ITO, IZO, ZnO, or $In_2O_3$ over/under the reflective layer.

A pixel definition layer 19 including an opening 190P exposing at least a portion of the pixel electrode 21 may be arranged over the pixel electrode 21. The pixel definition layer 19 may include an organic insulating material and/or an inorganic insulating material. The opening 190P may define an emission area of light emitted from the organic light emitting diode OLED. For example, the size/width of the opening 190P may correspond to the size/width of the emission area. Thus, the size and/or width of the pixel PX may depend on the size and/or width of the opening 190P of the pixel definition layer 19 corresponding thereto.

The emission layer 22 may be arranged in the opening 190P of the pixel definition layer 19. The emission layer 22 may include a high-molecular or low-molecular weight organic material for emitting light of a certain color. Alternatively, the emission layer 22 may include an inorganic light emitting material or may include quantum dots.

Although not illustrated, a first functional layer and a second functional layer may be arranged under and over the emission layer 22 respectively. For example, the first functional layer may include a hole transport layer (HTL) or may include an HTL and a hole injection layer (HIL). The second functional layer may include an electron transport layer (ETL) and/or an electron injection layer (EIL). However, the disclosure is not limited thereto. The first functional layer and the second functional layer may be selectively arranged over and under the emission layer 22 respectively.

Like the common electrode 23 described below, the first functional layer and/or the second functional layer may be a common layer formed to entirely cover the substrate 10.

The common electrode 23 may be arranged over the pixel electrode 21 and may overlap the pixel electrode 21. The common electrode 23 may include a conductive material having a low work function. For example, the common electrode 23 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the common electrode 23 may further include a layer such as ITO, IZO, ZnO, or $In_2O_3$ over the (semi)transparent layer including the above material. The common electrode 23 may be integrally formed to entirely cover the substrate 10.

An encapsulation member may be arranged over the display element layer DEL. In an embodiment, the encapsulation member may be provided as the thin film encapsulation layer TFE. The thin film encapsulation layer TFE may be arranged over the display element layer DEL and may cover the display element layer DEL. The thin film encapsulation layer TFE may include at least one inorganic layer and at least one organic layer. In an embodiment, the thin film encapsulation layer TFE may include a first inorganic layer 31, an organic layer 32, and a second inorganic layer 33 that are sequentially stacked. Although not illustrated, the encapsulation member may be provided as an encapsulation substrate.

The first inorganic layer 31 and the second inorganic layer 33 may include one or more inorganic materials among aluminum oxide, titanium oxide, tantalum oxide, hafnium oxide, zinc oxide, silicon oxide, silicon nitride, and silicon oxynitride. The organic layer 32 may include a polymer-based material. The polymer-based material may include acryl-based resin, epoxy-based resin, polyimide, polyethylene, and the like. In an embodiment, the organic layer 32 may include acrylate. The organic layer 32 may be formed by curing a monomer or applying a polymer.

The touch electrode layer TEL including touch electrodes may be arranged over the thin film encapsulation layer TFE, and the optical functional layer OFL may be arranged over the touch electrode layer TEL. The touch electrode layer TEL may be configured to obtain coordinate information according to an external input, for example, a touch event. The optical functional layer OFL may reduce the reflectance of light (external light) incident from the outside toward the display apparatus 1 and may improve the color purity of light emitted from the display apparatus 1.

In an embodiment, the optical functional layer OFL may include a phase retarder and/or a polarizer. The phase retarder may be a film type or a liquid crystal coating type and may include a λ/2 phase retarder and/or a λ/4 phase retarder. The polarizer may also be a film type or a liquid crystal coating type. The film type may include a stretched synthetic resin film, and the liquid crystal coating type may include liquid crystals arranged in a certain arrangement. The phase retarder and the polarizer may further include a protection film.

In an embodiment, the optical functional layer OFL may include a destructive interference structure. The destructive interference structure may include a first reflection layer and a second reflection layer arranged on different layers. First reflected light and second reflected light respectively reflected by the first reflection layer and the second reflection layer may destructively interfere with each other, and accordingly, the external light reflectance may be reduced.

An adhesive member may be arranged between the touch electrode layer TEL and the optical functional layer OFL. The adhesive member may include a general one known in the art, without limitation. For example, the adhesive member may include a pressure sensitive adhesive (PSA).

The cover window CW may be arranged over the display panel DP. The cover window CW may be adhered to the display panel DP by an adhesive member. The adhesive member may include, for example, a pressure sensitive adhesive (PSA).

The cover window CW may have a high transmittance to transmit light emitted from the display panel DP and may have a small thickness to minimize the weight of the display apparatus 1. Also, the cover window CW may have high rigidity and hardness to protect the display panel DP from an external impact. The cover window CW may include, for example, glass or plastic. In an embodiment, the cover window CW may include ultra-thin tempered glass whose rigidity is reinforced by a method such as chemical reinforcement or thermal reinforcement.

Although it has been described that the display apparatus 1 includes the organic light emitting diode OLED as a light emitting element, the display apparatus 1 of the disclosure is not limited thereto. In an embodiment, the display apparatus 1 may be an inorganic light emitting display apparatus (or an inorganic electroluminescence (EL) display apparatus) including an inorganic light emitting diode. The inorganic light emitting diode may include a PN junction diode including inorganic semiconductor-based materials. When a voltage is applied to a PN junction diode in a forward direction, holes and electrons may be injected thereinto and energy generated by recombination of the holes and electrons may be converted into light energy to emit light of a certain color. The inorganic light emitting diode described above may have a width of several to several hundred micrometers, and in an embodiment, the inorganic light emitting diode may be referred to as a micro LED.

Figure 4:
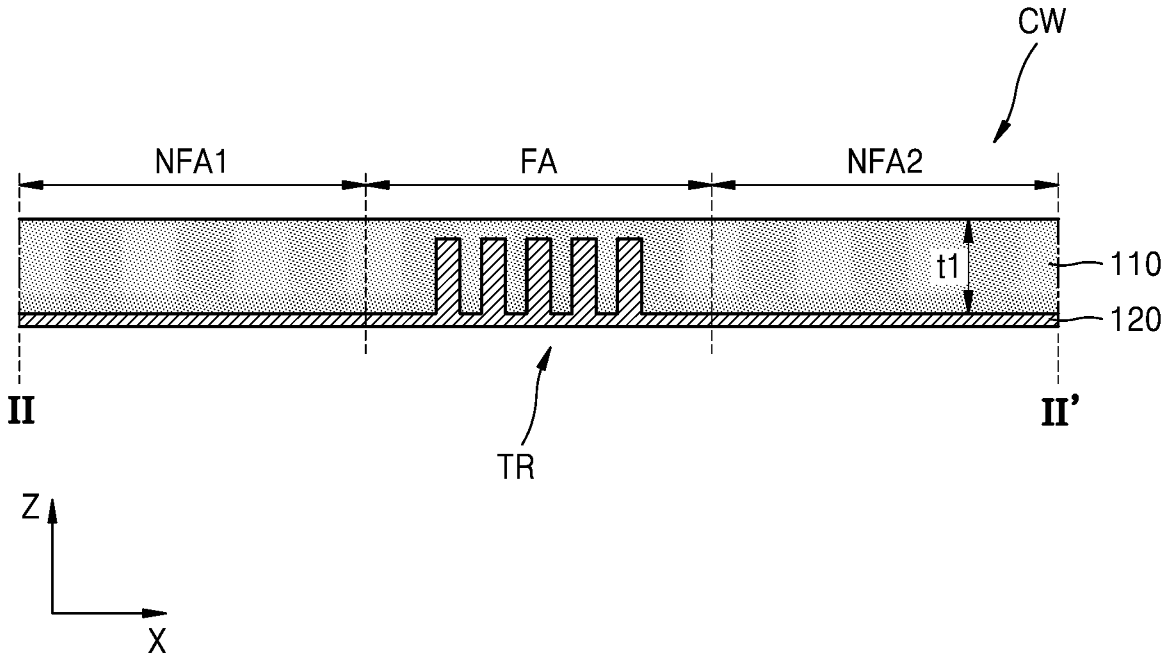
FIGS. 4 and 5 are cross-sectional views schematically illustrating a cover window according to an embodiment.
Figure 5:
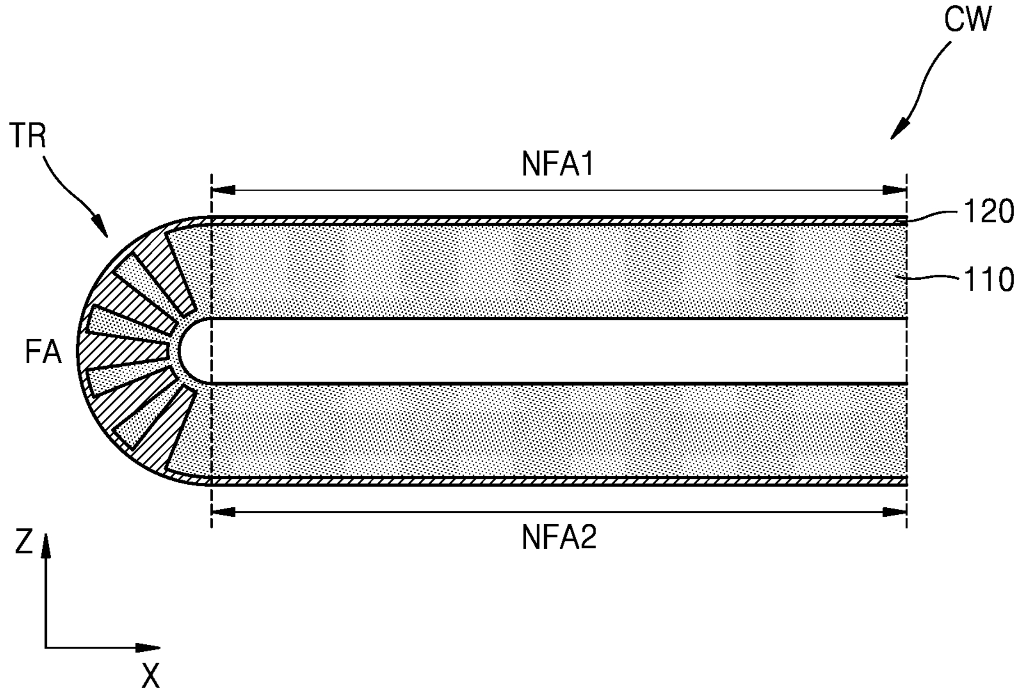

FIGS. 4 and 5 are cross-sectional views schematically illustrating a cover window according to an embodiment. FIG. 4 illustrates a state in which a cover window CW is unfolded, and FIG. 5 illustrates a state in which the cover window CW is folded.

A display apparatus according to an embodiment may include a display panel and a cover window CW. For convenience of description, FIGS. 4 and 5 schematically illustrate only the cover window CW of the display apparatus.

FIGS. 4 and 5, the cover window CW may include a cover layer 110 and a resin layer 120 arranged under the cover layer 110. In an embodiment, the cover layer 110 may include a first non-folding area NFA1, a second non-folding area NFA2, and a folding area FA. Alternatively, it may be understood that the first non-folding area NFA1, the second non-folding area NFA2, and the folding area FA are defined in the cover layer 110. Alternatively, it may be understood that the cover window CW includes the first non-folding area NFA1, the second non-folding area NFA2, and the folding area FA or the first non-folding area NFA1, the second non-folding area NFA2, and the folding area FA are defined in the cover window CW. The folding area FA may be an area located between the first non-folding area NFA1 and the second non-folding area NFA2 that are non-folding areas and may be an area folded when the display apparatus 1 (see FIGS. 1 and 2) is folded.

In an embodiment, the cover window CW may be in-folded or out-folded with respect to the folding axis FAX (see FIGS. 1 and 2). Here, in-folding may mean that the cover window CW is folded in the +z direction with respect to the folding axis FAX, and out-folding may mean that the cover window CW is folded in the −z direction with respect to the folding axis FAX. Alternatively, the cover layer 110 of the cover window CW may be in-folded or out-folded with respect to the folding axis FAX. Here, in-folding may mean that the cover layer 110 is folded in the +z direction with respect to the folding axis FAX, and out-folding may mean that the cover layer 110 is folded in the −z direction with respect to the folding axis FAX.

In an embodiment, the cover layer 110 may include ultra-thin glass (UTG). However, the disclosure is not limited thereto. In an embodiment, the cover layer 110 may include a polymer resin.

When the cover layer 110 includes ultra-thin glass and the thickness of the cover layer 110 is too small, the impact resistance characteristics of the cover layer 110 and/or the cover window CW including the cover layer 110 may be degraded or insufficient. For example, the pen drop characteristics of the cover layer 110 and/or the cover window CW including the cover layer 110 may be degraded or insufficient. However, when the thickness of the cover layer 110 including ultra-thin glass is too great, the folding characteristics of the cover layer 110 and/or the cover window CW including the cover layer 110 may be degraded or insufficient.

In an embodiment, the cover layer 110 may have a thickness t1 of about 100 (micrometers) μm to about 200 μm. When the thickness t1 of the cover layer 110 is less than 100 μm, the impact resistance characteristics of the cover layer 110 and/or the cover window CW including the cover layer 110 may be degraded or insufficient as described above. On the other hand, when the thickness t1 of the cover layer 110 is greater than 200 μm, the folding characteristics of the cover layer 110 and/or the cover window CW including the cover layer 110 may be degraded or insufficient. Thus, when the thickness t1 of the cover layer 110 is about 100 μm to about 200 μm, the impact resistance characteristics of the cover layer 110 and/or the cover window CW including the cover layer 110 may be improved (acceptable) and simultaneously the folding characteristics of the cover layer 110 and/or the cover window CW including the cover layer 110 may be improved (acceptable).

In an embodiment, the cover layer 110 may include trenches TR. For example, the trenches TR may be formed in the cover layer 110. The trenches TR may be spaced apart from each other in the x direction in a vertical cross-sectional view and may extend in the y direction. The trenches TR may be located in the folding area FA of the cover layer 110. As such, when the trenches TR are arranged (or located or formed) in the folding area FA of the cover layer 110, the cover layer 110 and/or the cover window CW including the cover layer 110 may be more easily folded.

In an embodiment, the resin layer 120 may be arranged under the cover layer 110. In an embodiment, the resin layer 120 may fill (or charge) the trenches TR formed in the cover layer 110. In an embodiment, the resin layer 120 may be formed through a process of coating and/or filling (or charging) a resin composition at the front surface and the trenches TR of the cover layer 110 through a process such as inkjet printing, squeeze printing, or roll lamination printing and then curing the same.

In this case, the inkjet printing process may be a process of forming a layer by discharging ink droplets through a nozzle. The resin composition may be discharged to the front surface and the trenches TR of the cover layer 110 through the nozzle and then the resin composition may be coated and/or filled (or charged) at the front surface and/or the trenches TR of the cover layer 110.

Also, the roll lamination printing process may be a process of forming a layer by using a dispenser and a pressurizer. The resin composition may be coated and/or filled (or filled) at the front surface and/or the trenches TR of the cover layer 110 by providing the resin composition on the front surface and/or the trenches TR of the cover layer 110 through the dispenser and then applying pressure to the resin composition through the pressurizer including a roller or a blade.

The resin layer 120 may be formed by coating and/or filling (or charging) the resin composition at the front surface and/or the trenches TR of the cover layer 110 and then curing the resin composition by irradiating ultraviolet rays with an energy of about 1000 millijoules (mJ) to about 2000 mJ. In this case, the ultraviolet rays may have a wavelength of about 320 nm to about 400 nm, for example, about 365 nm to about 389 nm.

In an embodiment, the resin layer 120 may include a resin composition including a (meth)acrylate copolymer. For example, the resin layer 120 may be formed (or manufactured) by curing (e.g., photo-curing) the resin composition.

When the trenches TR are formed to correspond to the folding area FA of the cover layer 110, the trenches may have poor visibility characteristics. Particularly, the trenches TR formed in the folding area FA of the cover layer 110 may be visually recognized by the user, and thus, the display quality may be degraded, e.g., somewhat distorted. However, when the refractive index of the cover layer 110 is similar to the refractive index of the resin layer 120 filling the trenches TR formed in the cover layer 110, the trenches TR may not be as easily visually recognizable.

In general, the refractive index of the resin composition including a (meth)acrylate copolymer and/or the resin layer 120 manufactured therethrough may be about 1.4 to about 1.45, and the refractive index of an ultra-thin glass may be about 1.5 to about 1.6. Accordingly, Applicant identifies that maybe the refractive index of the resin layer 120 should be increased in order to make the refractive index of the cover layer 110 substantially similar to the refractive index of the resin layer 120 filling the trenches TR formed in the cover layer 110.

In an embodiment, the resin composition may include a (meth)acrylate copolymer. The (meth)acrylate copolymer may include a first repeat unit derived from a first monomer represented by Formula 1 and a second repeat unit derived from a second monomer represented by Formula 2.

Formula 1

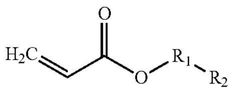

In Formula 1, $R_1$ may be a $C_1$ to $C_6$ alkylene group, a $C_1$ to $C_6$ alkylene group with one or more oxygen atoms, or an arylene group, $R_2$ may be a $C_1$ to $C_6$ alkyl group, a $C_1$ to $C_6$ alkyl group with one or more oxygen atoms, or an aromatic group, and at least one of $R_1$ or $R_2$ may include an aromatic group. For example, at least $R_1$ may include an optionally phenylene or $R_2$ may include an optionally substituted phenyl group.

Formula 2

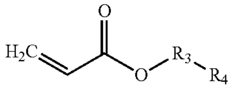

In Formula 2, $R_3$ may be a $C_1$ to $C_6$ alkylene group or a $C_1$ to $C_6$ alkylene group with one or more oxygen atoms, and $R_4$ may be a $C_1$ to $C_6$ alkyl group or a $C_1$ to $C_6$ alkyl group with one or more oxygen atoms.

In an embodiment, the first monomer represented by Formula 1 may include an aromatic group, i.e., an aromatic group in the first monomer. That is, the first monomer represented by Formula 1 may have aromaticity by including an aromatic group.

In an embodiment, the second monomer represented by Formula 2 may include an aliphatic group, i.e., an aliphatic or an alicyclic group in the second monomer. That is, the second monomer represented by Formula 2 may include a hydrocarbon group other than an aromatic group.

In general, the refractive index of an acrylate-based material may be about 1.4 to about 1.45, and the refractive index of ultra-thin glass may be about 1.5 to about 1.6.

When the (meth)acrylate copolymer includes an aromatic group, the refractive index of a protection layer may increase. However, when the content of the aromatic group in the (meth)acrylate copolymer increases, the modulus and the glass transition temperature Tg of the resin layer 120 may also increase. In this case, when the modulus of the resin layer 120 increases, the folding characteristics of the cover window CW including the resin layer 120 may be poor or insufficient. Also, a polymer compound may have flexibility at a temperature above the glass transition temperature Tg, and when the glass transition temperature Tg increases, the resin layer 120 may reach the glass transition temperature Tg and thus the modulus of the resin layer 120 may increase and the folding characteristics of the cover window CW including the resin layer 120 may be poor or insufficient.

Thus, it may be necessary to adjust the content of aromatic moieties included in the (meth)acrylate copolymer. In an embodiment, the content of the first repeat unit derived from the first monomer represented by Formula 1 in the (meth)acrylate copolymer may be about 20 weight percent (wt %) to about 80 wt % with respect to the total amount (or 100 wt %) of the monomeric units present in the (meth) acrylate copolymer. In this case, when the content of the first repeat unit derived from the first monomer represented by Formula 1 in the (meth)acrylate copolymer is less than 20 wt % with respect to the total amount of the monomeric units present in the (meth)acrylate copolymer, the absolute value of the difference between the refractive index of the resin layer 120 including the (meth)acrylate copolymer and the refractive index of the cover layer 110 may be greater than 0.03. On the other hand, when the content of the first repeat unit derived from the first monomer represented by Formula 1 in the (meth)acrylate copolymer is greater than 80 wt % with respect to the total amount of monomeric units present in the (meth)acrylate copolymer, the modulus and the glass transition temperature Tg of the resin layer 120 including the (meth)acrylate copolymer may increase, and thus, the folding characteristics of the cover window CW including the resin layer 120 may be insufficient or degraded.

Thus, because the content of the first repeat unit derived from the first monomer represented by Formula 1 in the (meth)acrylate copolymer is about 20 wt % to about 80 wt % with respect to the total amount of monomeric units present in the (meth)acrylate copolymer, the absolute value of the difference between the refractive index of the resin layer 120 including the (meth)acrylate copolymer and the refractive index of the cover layer 110 may be 0.03 or less to prevent the trenches TR from being visually recognized, and simultaneously, the modulus and the glass transition temperature Tg of the resin layer 120 including the (meth) acrylate copolymer may be reduced to improve the folding characteristics of the cover window CW including the resin layer 120.

In an embodiment, the resin layer 120 may include a (meth)acrylate copolymer in which the content of the first repeat unit derived from the first monomer represented by Formula 1 is about 20 wt % to about 80 wt % with respect to the total amount of monomeric units present in the (meth)acrylate copolymer. In an embodiment, the resin layer 120 may fill (or charge) the trenches TR formed in the cover layer 110, and the refractive index of the resin layer 120 may be substantially equal to the refractive index of the cover layer 110. Particularly, the cover layer 110 may have a first refractive index with respect to a first wavelength (e.g., 589 nm wavelength), the resin layer 120 may have a second refractive index with respect to the first wavelength, and the absolute value of the difference between the first refractive index and the second refractive index may be 0.03 or less. That is, the absolute value of the difference between the refractive index of the cover layer 110 and the refractive index of the resin layer 120 with respect to the same wavelength may be 0.03 or less. However, the disclosure is not limited thereto. In an embodiment, the absolute value of the difference between the refractive index of the cover layer 110 and the refractive index of the resin layer 120 with respect to the same wavelength may be about 0.02 or less, 0.01 or less, or may be about 0.005 or less.

For example, when the cover layer 110 has a refractive index of about 1.5 to about 1.6 with respect to the first wavelength, the resin layer 120 may have a refractive index of about 1.45 to about 1.65 with respect to the first wavelength. Alternatively, when the cover layer 110 has a refractive index of about 1.5 to about 1.6 with respect to the first wavelength, the resin layer 120 may have a refractive index of about 1.48 to about 1.62 with respect to the first wavelength and may have a refractive index of about 1.495 to about 1.605.

Also, in an embodiment, the content of the second repeat unit derived from the second monomer represented by Formula 2 in the (meth)acrylate copolymer may be about 20 wt % to about 80 wt % with respect to the total amount of monomeric units present in the (meth)acrylate copolymer.

In an embodiment, the resin composition may further include a crosslinker and/or a photoinitiator. In an embodiment, the crosslinker may include 1,6-hexanediol diacrylate, ethylene glycol diacrylate, 1,6-hexanediol ethoxylate diacrylate, di(ethylene glycol) diacrylate, tripropylene glycol diacrylate, or any combination thereof.

In an embodiment, the photoinitiator may include any one material or any mixture of two or more of 2-hydroxy-2-methyl-1-phenyl-1-propanone, alpha-dimethoxy-alpha-phenylacetophenone, 2-hydroxy-1 [4-(2-hydroxyethoxy)phenyl]-2-methyl-1-propanone, methylbenzoyl formate, diphenyl(2,4,6-trimethylbenzoyl)-phosphine oxide, 1-hydroxy-cyclohexyl-phenyl-ketone, or bis(2,4,6-trimethylbenzoyl)-phenylphosphine oxide.

In an embodiment, the content of the crosslinker may be about 10 wt % to about 40 wt % with respect to the total amount (or 100 wt %) of monomeric units present in the (meth)acrylate copolymer. For example, if the total amount of monomer units in the (meth)acrylate copolymer is 100 grams, then the crosslinker is present in an amount of about 10 grams (for a total of 110 grams) to about 40 grams (for a total of 140 grams). When the content of the crosslinker is less than 10 wt %, the crosslinking degree of the resin may be too low, or when the content of the crosslinker is greater than 40 wt %, the crosslinking degree of the resin may be too high, and thus, the modulus of the resin may be too high. Thus, because the content of the crosslinker is about 10 wt % to about 40 wt %, the resin may have a suitable level of crosslinking degree.

In an embodiment, the content of the photoinitiator may be about 1 wt % with respect to the total amount (or 100 wt %) of monomeric units present in the (meth)acrylate copolymer.

In an embodiment, the resin layer 120 may have a modulus of about 0.1 Megapascals (MPa) to about 1.0 MPa at −20° C. Alternatively, the resin layer 120 may have a modulus of about 0.1 MPa to about 0.3 MPa at −20° C. Because the modulus of the resin layer 120 at −20° C. is about 0.1 MPa to about 1.0 MPa, for example, about 0.1 MPa to about 0.3 MPa, the folding characteristics of the cover window CW including the resin layer 120 may be improved.

In an embodiment, the resin layer 120 may have a modulus of about 0.01 MPa to about 0.04 MPa at 25° C. Because the modulus of the resin layer 120 at 25° C. is about 0.01 MPa to about 0.04 MPa, the folding characteristics of the cover window CW including the resin layer 120 may be improved.

In an embodiment, the resin layer 120 may have a modulus of about 0.01 MPa to about 0.03 MPa at 65° C. Because the modulus of the resin layer 120 at 65° C. is about 0.01 MPa to about 0.03 MPa, the folding characteristics of the cover window CW including the resin layer 120 may be improved.

In an embodiment, the glass transition temperature Tg of the resin layer 120 may be −20° C. or less. Alternatively, the glass transition temperature Tg of the resin layer 120 may be −25° C. or less. Because the glass transition temperature Tg of the resin layer 120 is −20° C. or less, or −25° C. or less, the increase of the modulus of the resin layer 120 may be prevented, and simultaneously, the folding characteristics of the cover window CW including the resin layer 120 may be improved.

In an embodiment, the elongation of the resin layer 120 may be 210% or more. For example, the elongation of the resin layer 120 may be 220% or more or 230% or more. For example, the elongation of the resin layer 120 may be 240% or more. Because the elongation of the resin layer 120 is 210% or more, 220% or more, 230% or more, or 240% or more, the folding characteristics of the cover window CW including the resin layer 120 may be improved.

In an embodiment, the adhesion of the resin layer 120 at room temperature may be 960 grams-force per inch (gf/inch) or more. For example, the adhesion of the resin layer 120 at room temperature may be 1000 gf/inch or more. Because the adhesion of the resin layer 120 at room temperature is 960 gf/inch or more or 1000 gf/inch or more, the delamination of the resin layer 120 from the cover layer 110 may be prevented or minimized.

Figure 6:
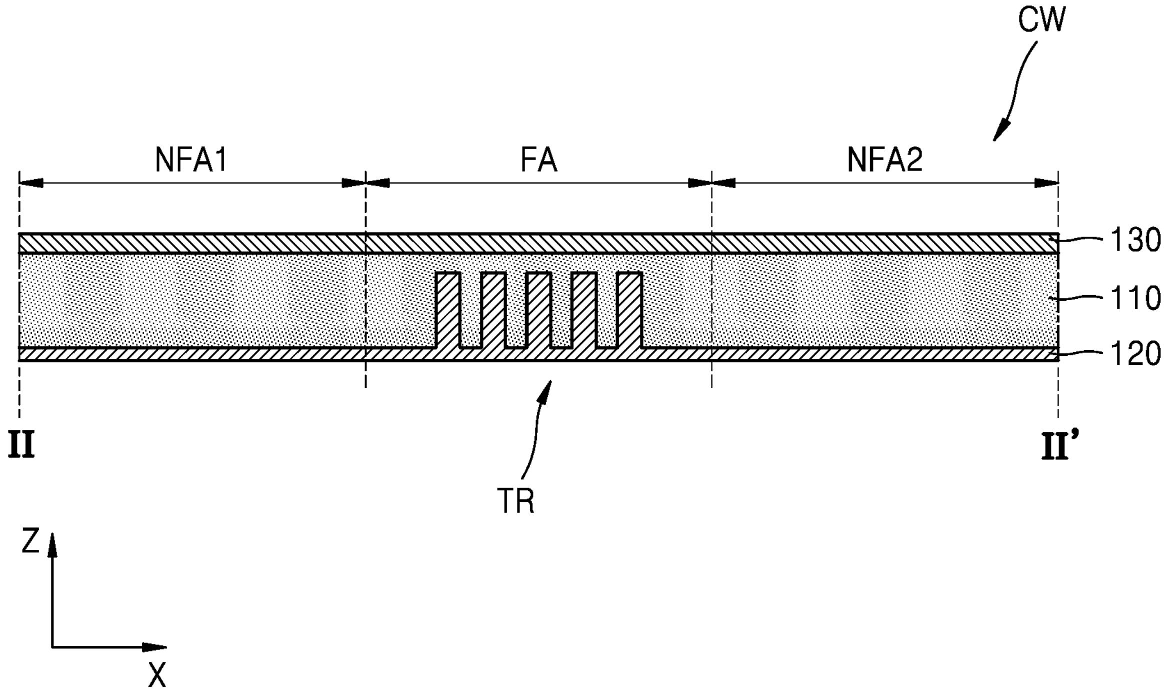
FIG. 6 is a cross-sectional view schematically illustrating a cover window according to an embodiment.

FIG. 6 is a cross-sectional view schematically illustrating a cover window according to an embodiment. The embodiment of FIG. 6 may be different from the embodiment of FIG. 4 described above in that a protection layer 130 is further arranged over a cover layer 110. In FIG. 6, like reference numerals as those in FIG. 4 will denote like members, and thus, redundant descriptions thereof will be omitted for conciseness.

Referring to FIG. 6, a cover window CW may include a cover layer 110, a resin layer 120, and a protection layer 130. The resin layer 120 may be arranged under the cover layer 110, and the protection layer 130 may be arranged over the cover layer 110.

In an embodiment, the protection layer 130 may include a polymer resin. For example, the protection layer 130 may include acryl-based resin, epoxy-based resin, polyimide, and/or polyethylene. However, the disclosure is not limited thereto.

Figure 7:
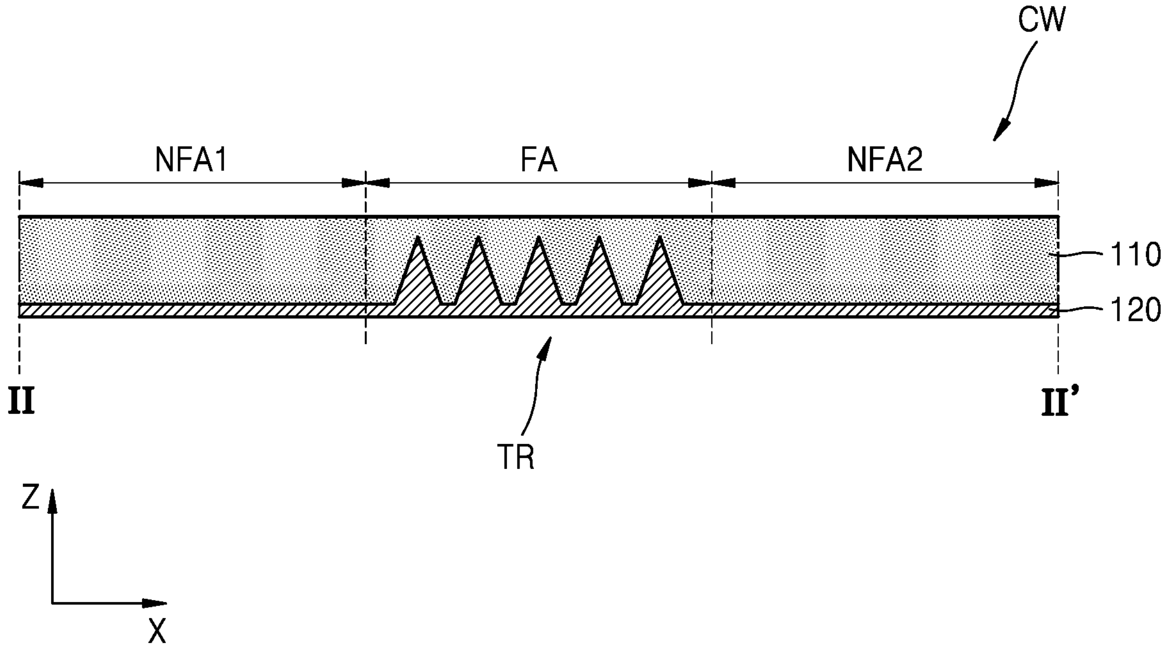
FIGS. 7 to 9 are cross-sectional views schematically illustrating a cover window according to an embodiment.
Figure 8:
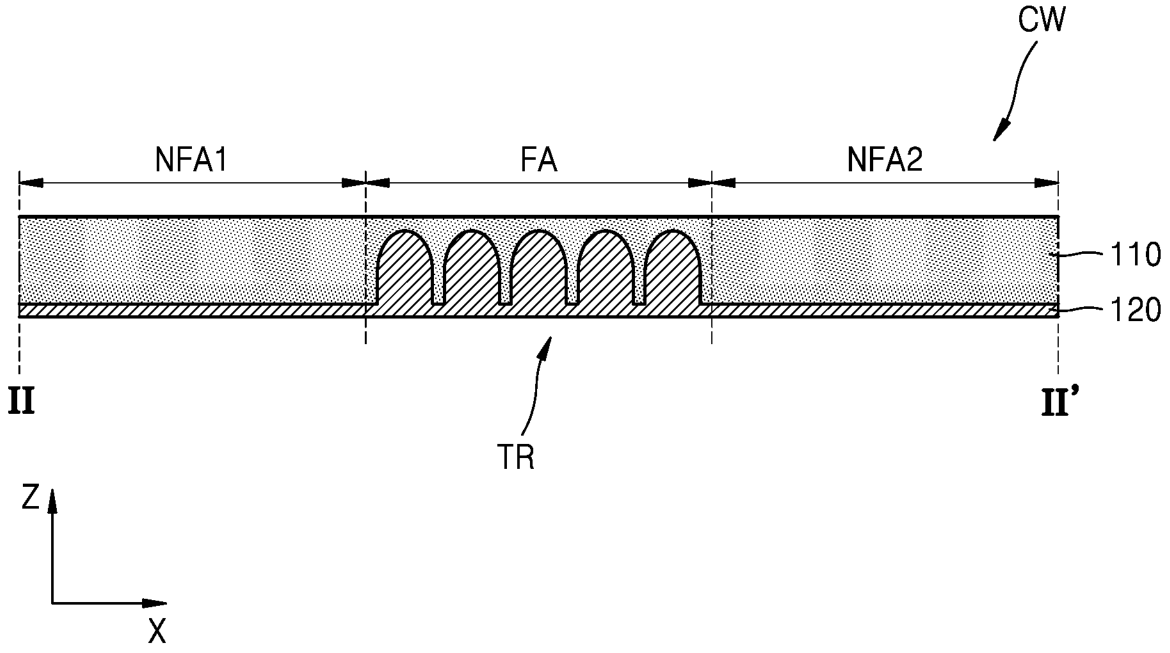
Figure 9:
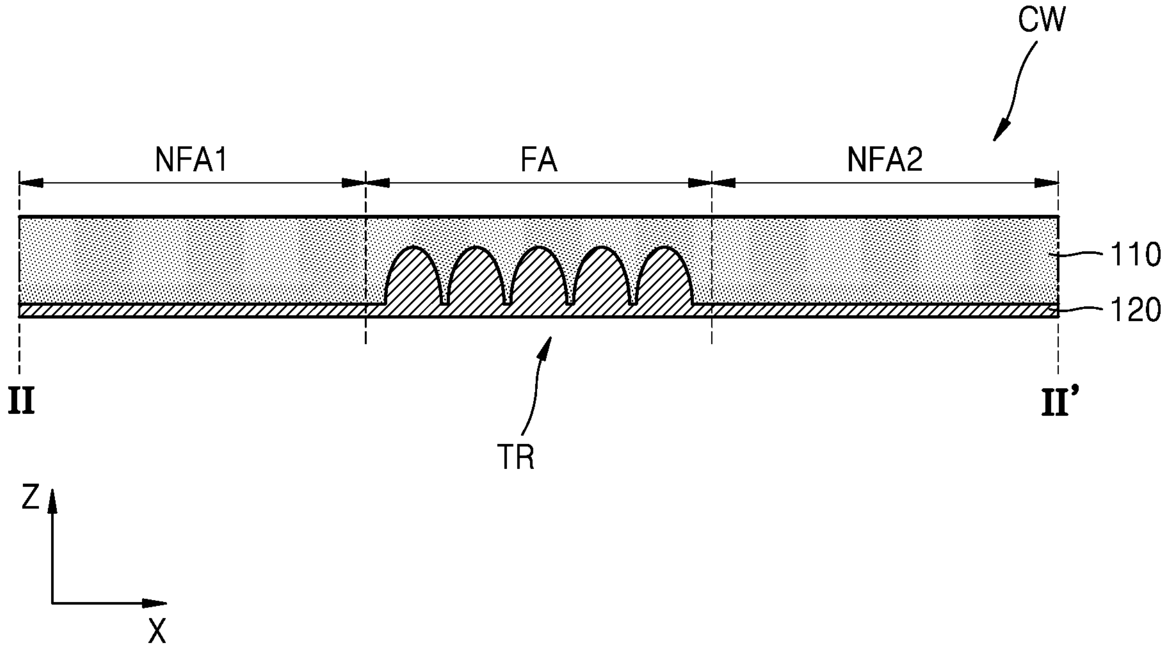

FIGS. 7 to 9 are cross-sectional views schematically illustrating a cover window according to an embodiment. FIGS. 7 to 9 are views for describing the shape of trenches TR formed in a cover layer 110.

Referring to FIGS. 4, 7, 8, and 9, trenches TR may be formed in the cover layer 110. The trenches TR may be spaced apart from each other in the x direction in a vertical cross-sectional view and may extend in the y direction. The trenches TR may be located in the folding area FA of the cover layer 110.

In an embodiment, the trenches TR formed in the cover layer 110 may have various shapes. For example, as illustrated in FIG. 4, the trenches TR formed in the cover layer 110 may have a rectangular shape. Alternatively, as illustrated in FIG. 7, the trenches TR formed in the cover layer 110 may have a triangular shape. Alternatively, as illustrated in FIG. 8, the trenches TR formed in the cover layer 110 may have an inverted U shape. Alternatively, as illustrated in FIG. 9, the trenches TR formed in the cover layer 110 may have a semicircular shape. However, the disclosure is not limited thereto. In an embodiment, the trenches TR formed in the cover layer 110 may have various shapes such as an elliptical shape and a polygonal shape.

Figure 10:
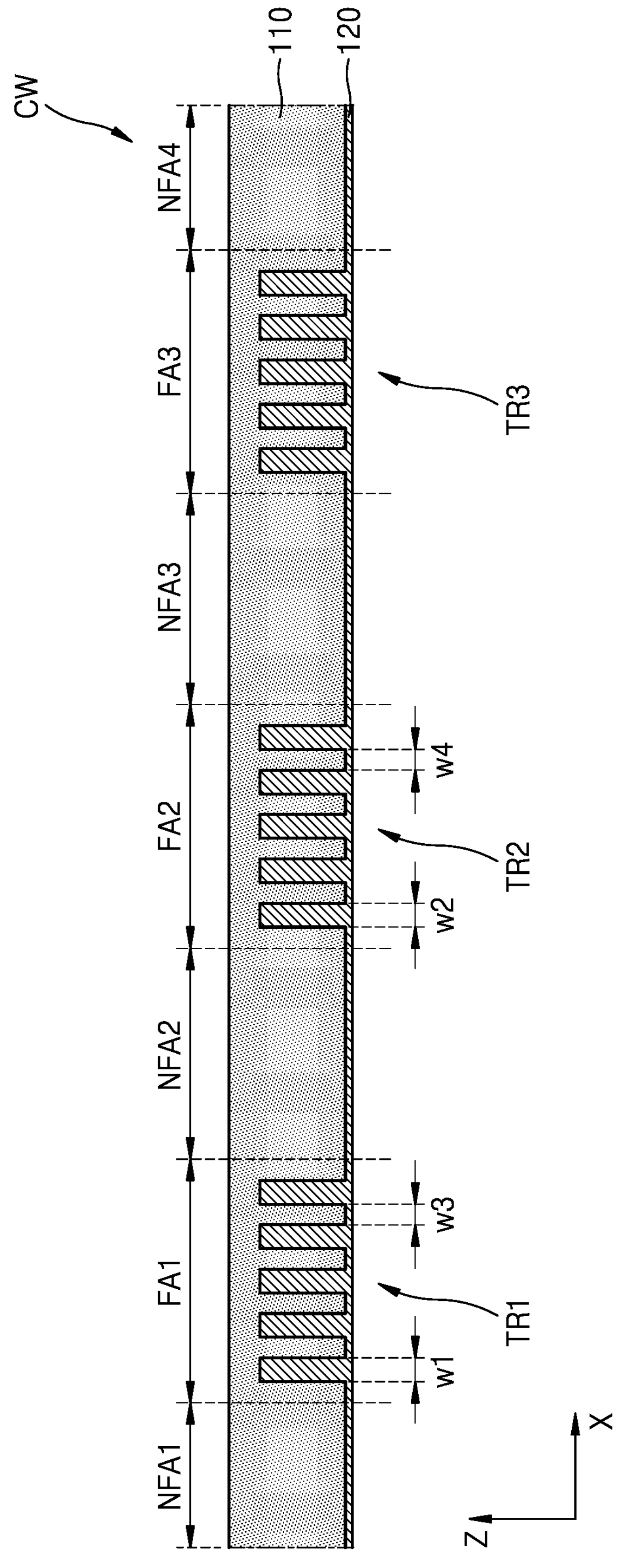
FIG. 10 is a cross-sectional view schematically illustrating a cover window according to an embodiment.

FIG. 10 is a cross-sectional view schematically illustrating a cover window according to an embodiment. The embodiment of FIG. 10 may be different from the embodiment of FIG. 4 in that a plurality of folding areas are provided in a cover window CW and trenches are provided to correspond to the respective folding areas. In FIG. 10, like reference numerals as those in FIG. 4 will denote like members, and thus, redundant descriptions thereof will be omitted for conciseness.

Referring to FIG. 10, the cover window CW may include a cover layer 110 and a resin layer 120 arranged under the cover layer 110. In an embodiment, the cover layer 110 may include a first non-folding area NFA1, a second non-folding area NFA2, a third non-folding area NFA3, a fourth non-folding area NFA4, a first folding area FA1, a second folding area FA2, and a third folding area FA3. The first folding area FA1 may be located between the first non-folding area NFA1 and the second non-folding area NFA2, the second folding area FA2 may be located between the second non-folding area NFA2 and the third non-folding areas NFA3, and the third folding area FA3 may be located between the third non-folding area NFA3 and the fourth non-folding area NFA4. However, the disclosure is not limited thereto.

Alternatively, in an embodiment, it may be understood that the cover window CW includes the first non-folding area NFA1, the second non-folding area NFA2, the third non-folding area NFA3, the fourth non-folding area NFA4, the first folding area FA1, the second folding area FA2, and the third folding area FA3 or the first non-folding area NFA1, the second non-folding area NFA2, the third non-folding area NFA3, the fourth non-folding area NFA4, the first folding area FA1, the second folding area FA2, and the third folding area FA3 are defined in the cover window CW.

In an embodiment, the cover layer 110 may include trenches TR1, TR2, and TR3. For example, first trenches TR1, second trenches TR2, and third trenches TR3 may be formed in the cover layer 110. The trenches TR may be spaced apart from each other in the x direction in a vertical cross-sectional view and may extend in the y direction.

In an embodiment, the trenches TR1, TR2, and TR3 may be located in the folding areas FA1, FA2, and FA3 of the cover layer 110. More particularly, the first trenches TR1 may be located in the first folding area FA1 of the cover layer 110, the second trenches TR2 may be located in the second folding area FA2 of the cover layer 110, and the third trenches TR3 may be located in the third folding area FA3 of the cover layer 110. As such, when the trenches TR are arranged (or located or formed) in the folding areas FA1, FA2, and FA3 of the cover layer 110, the cover layer 110 and/or the cover window CW including the cover layer 110 may be more easily folded.

In an embodiment, the trenches TR1, TR2, and TR3 may have the same width. Particularly, a width w2 of the second trench TR2 located at a center portion of the cover layer 110 or the cover window CW may be equal to a width w1 of the first trench TR1 located at a side portion of the cover layer 110 or the cover window CW. In this case, the widths w1 and w2 of the trenches TR1 and TR2 may respectively represent the widths of the trenches TR1 and TR2 in the x direction.

The width of the third trench TR3 may be equal to the width w1 of the first trench TR1. However, the disclosure is not limited thereto. The width of the third trench TR3 may be different from the width w1 of the first trench TR1.

In an embodiment, the widths between the trenches TR1, TR2, TR3, or other trenches may be the same or different from one another, For example, the width of trenches TR1, TR2, and TR3 adjacent to the other may be the same or different from each other. In an embodiment, the width of trenches TR1, TR2, and TR3 adjacent to the other may be equal to each other. Particularly, a width w4 between the second trenches TR2 located at a center portion of the cover layer 110 or the cover window CW may be equal to (or the same as) a width w3 between the first trenches TR1 located at a side portion of the cover layer 110 or the cover window CW. In this case, the width between each of the trenches TR1, TR2, and TR3 may represent a width in the x direction.

The width between the third trenches TR3 may be equal to the width w3 between the first trenches TR1. However, the disclosure is not limited thereto. The width between the third trenches TR3 may be different from the width w3 between the first trenches TR1.

Although FIG. 10 illustrates that the width w1 of the first trench TR1 is equal to the width w2 of the second trench TR2 and the width w3 between the first trenches TR1 adjacent to each other is equal to the width w4 between the second trenches TR2 adjacent to each other, the disclosure is not limited thereto. For example, the width w1 of the first trench TR1 may be equal to the width w2 of the second trench TR2, but the width w3 between the first trenches TR1 adjacent to each other may be different from the width w4 between the second trenches TR2 adjacent to each other. Also, the width w3 between the first trenches TR1 adjacent to each other may be equal to the width w4 between the second trenches TR2 adjacent to each other, but the width w1 of the first trench TR1 may be different from the width w2 of the second trench TR2.

Figure 11:
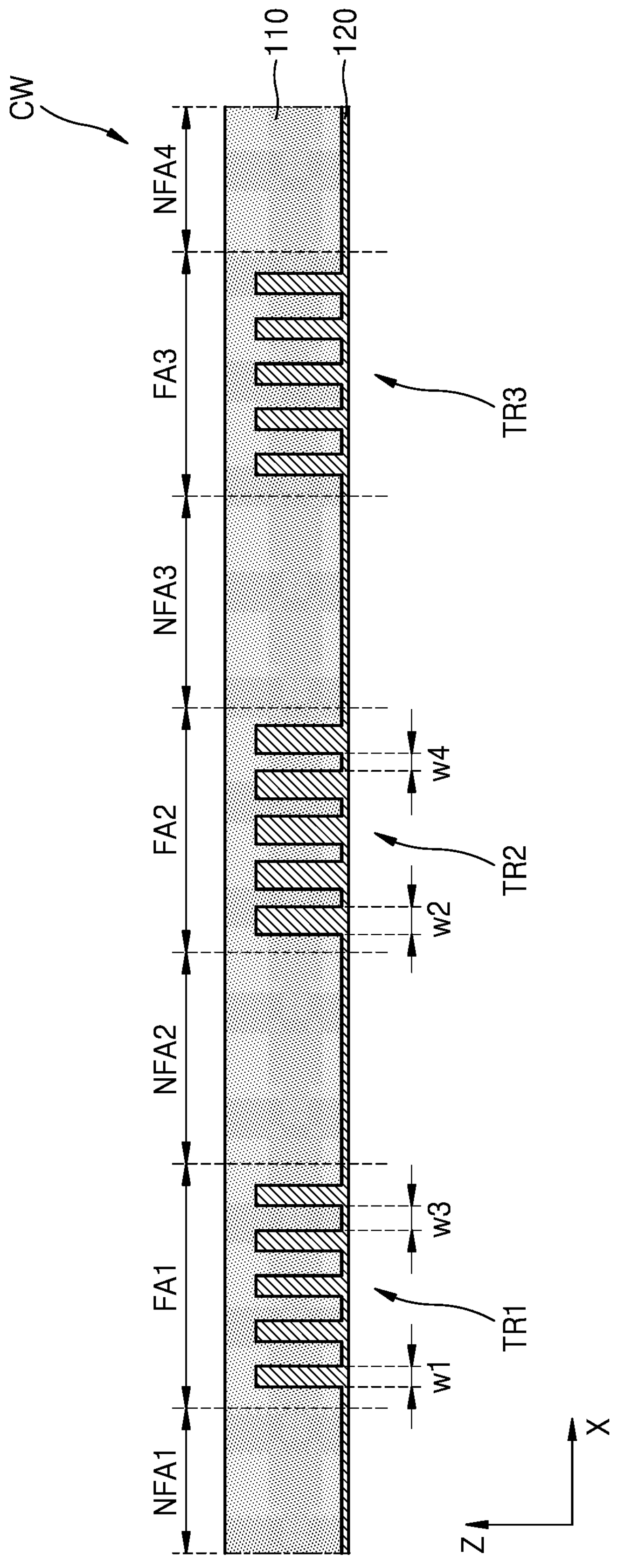
FIG. 11 is a cross-sectional view schematically illustrating a cover window according to an embodiment.

FIG. 11 is a cross-sectional view schematically illustrating a cover window according to an embodiment. The embodiment of FIG. 11 may be different from the embodiment of FIG. 10 in that a width w1 of the first trench TR1 is less than a width w2 of the second trench TR2. In FIG. 11, like reference numerals as those in FIG. 10 will denote like members, and thus, redundant descriptions thereof will be omitted for conciseness.

Referring to FIG. 11, in an embodiment, the widths of the trenches TR1, TR2, and TR3 may be different from each other. Particularly, the width w2 of the second trench TR2 located at a center portion of the cover layer 110 or the cover window CW may be greater than the width w1 of the first trench TR1 located at a side portion of the cover layer 110 or the cover window CW. In this case, the widths of the trenches TR1 and TR2 may respectively represent the widths of the trenches TR1 and TR2 in the x direction.

The width of the third trench TR3 may be equal to the width w1 of the first trench TR1. However, the disclosure is not limited thereto. The width of the third trench TR3 may be different from the width w1 of the first trench TR1.

In an embodiment, the widths between the trenches TR1, TR2, and TR3 adjacent to each other may be different from each other. Particularly, a width w4 between the second trenches TR2 located at a center portion of the cover layer 110 or the cover window CW may be less than a width w3 between the first trenches TR1 located at a side portion of the cover layer 110 or the cover window CW. In this case, the widths between the trenches TR1 and TR2 may respectively represent the widths between the trenches TR1 and TR2 in the x direction.

The width between the third trenches TR3 may be equal to the width w3 between the first trenches TR1. However, the disclosure is not limited thereto. The width between the third trenches TR3 may be different from the width w3 between the first trenches TR1.

Although FIG. 11 illustrates that the width w1 of the first trench TR1 is less than the width w2 of the second trench TR2 and the width w3 between the first trenches TR1 adjacent to each other is greater than the width w4 between the second trenches TR2 adjacent to each other, the disclosure is not limited thereto. For example, the width w1 of the first trench TR1 may be less than the width w2 of the second trench TR2, and the width w3 between the first trenches TR1 adjacent to each other may be less than the width w4 between the second trenches TR2 adjacent to each other.

Figure 12:
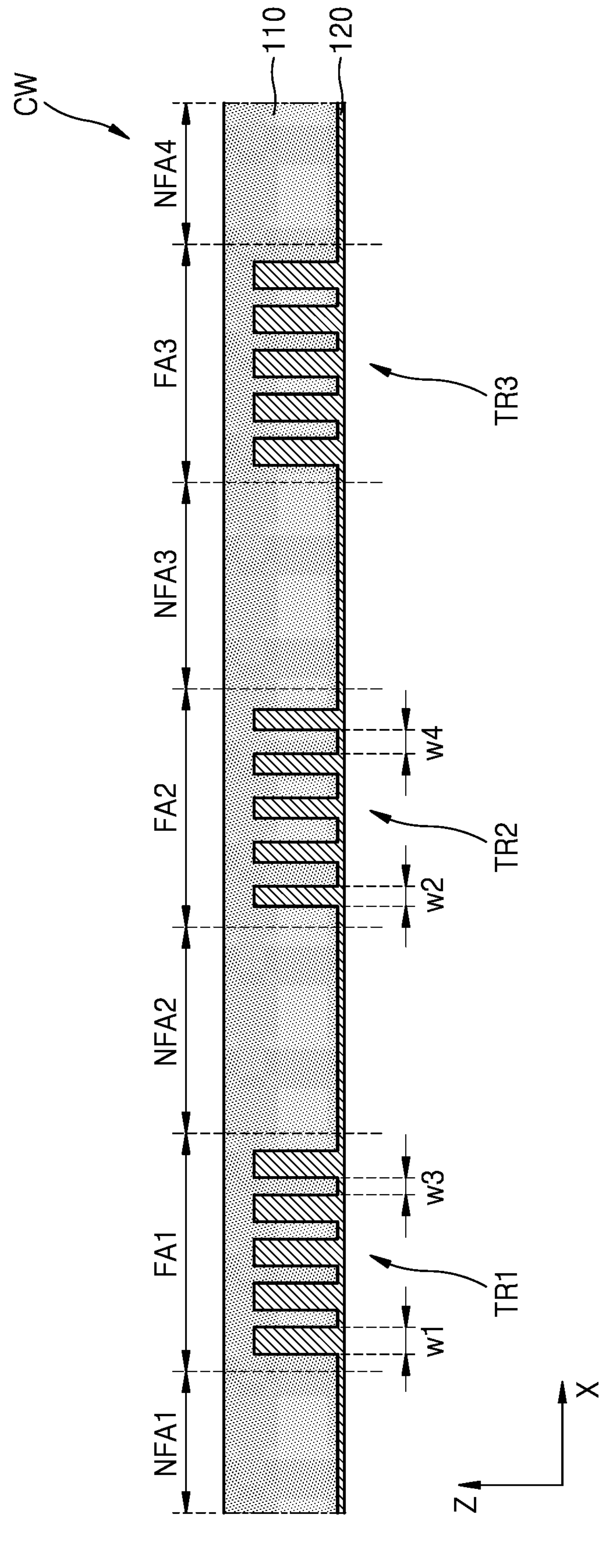
FIG. 12 is a cross-sectional view schematically illustrating a cover window according to an embodiment.

FIG. 12 is a cross-sectional view schematically illustrating a cover window according to an embodiment. The embodiment of FIG. 12 may be different from the embodiment of FIG. 10 in that a width w1 of the first trench TR1 is greater than a width w2 of the second trench TR2. In FIG. 12, like reference numerals as those in FIG. 10 will denote like members, and thus, redundant descriptions thereof will be omitted for conciseness.

Referring to FIG. 12, in an embodiment, the widths of the trenches TR1, TR2, and TR3 may be different from each other. Particularly, the width w2 of the second trench TR2 located at a center portion of the cover layer 110 or the cover window CW may be less than the width w1 of the first trench TR1 located at a side portion of the cover layer 110 or the cover window CW. In this case, the widths of the trenches TR1 and TR2 may respectively represent the widths of the trenches TR1 and TR2 in the x direction.

The width of the third trench TR3 may be equal to the width w1 of the first trench TR1. However, the disclosure is not limited thereto. The width of the third trench TR3 may be different from the width w1 of the first trench TR1.

In an embodiment, the widths between the trenches TR1, TR2, and TR3 adjacent to each other may be different from each other. Particularly, a width w4 between the second trenches TR2 located at a center portion of the cover layer 110 or the cover window CW may be greater than a width w3 between the first trenches TR1 located at a side portion of the cover layer 110 or the cover window CW. In this case, the widths between the trenches TR1 and TR2 may respectively represent the widths between the trenches TR1 and TR2 in the x direction.

The width between the third trenches TR3 may be equal to the width w3 between the first trenches TR1. However, the disclosure is not limited thereto. The width between the third trenches TR3 may be different from the width w3 between the first trenches TR1.

Although FIG. 12 illustrates that the width w1 of the first trench TR1 is greater than the width w2 of the second trench TR2 and the width w3 between the first trenches TR1 adjacent to each other is less than the width w4 between the second trenches TR2 adjacent to each other, the disclosure is not limited thereto. For example, the width w1 of the first trench TR1 may be greater than the width w2 of the second trench TR2, and the width w3 between the first trenches TR1 adjacent to each other may be greater than the width w4 between the second trenches TR2 adjacent to each other.

Figure 13:
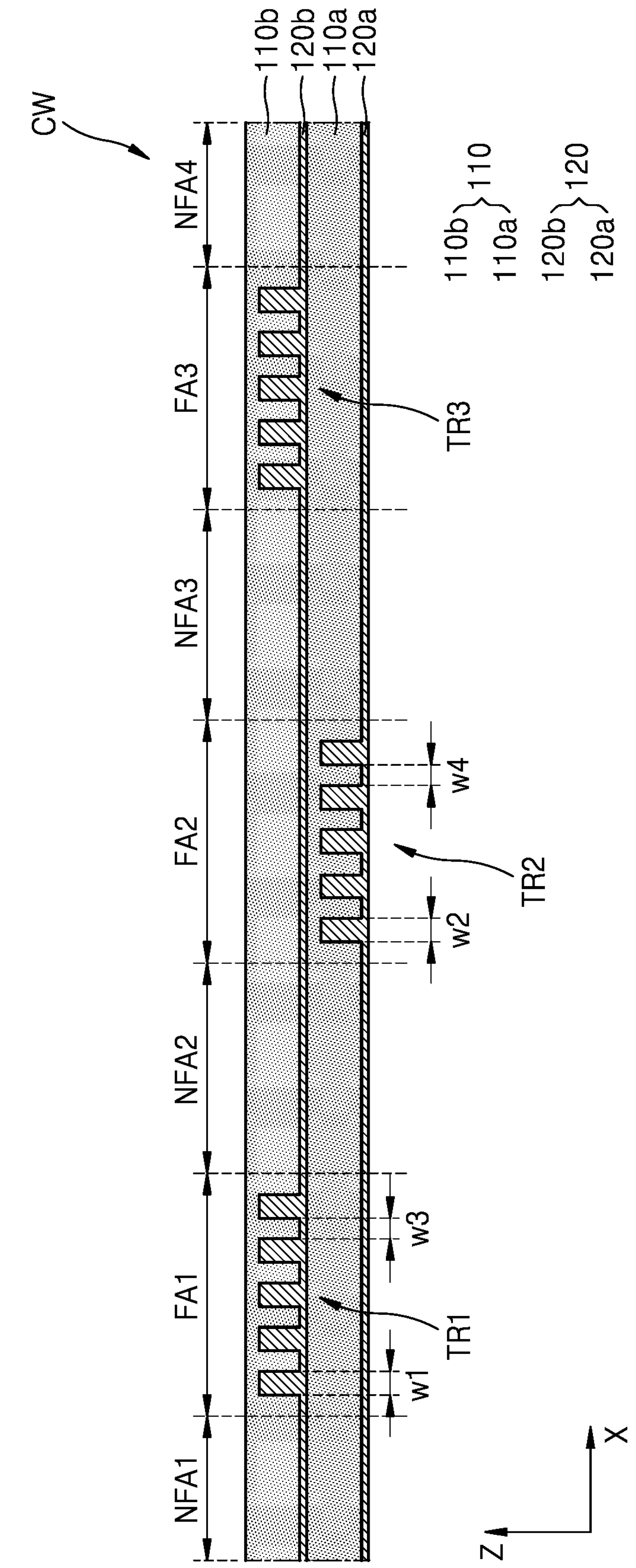
FIG. 13 is a cross-sectional view schematically illustrating a cover window according to an embodiment.
Figure 14:
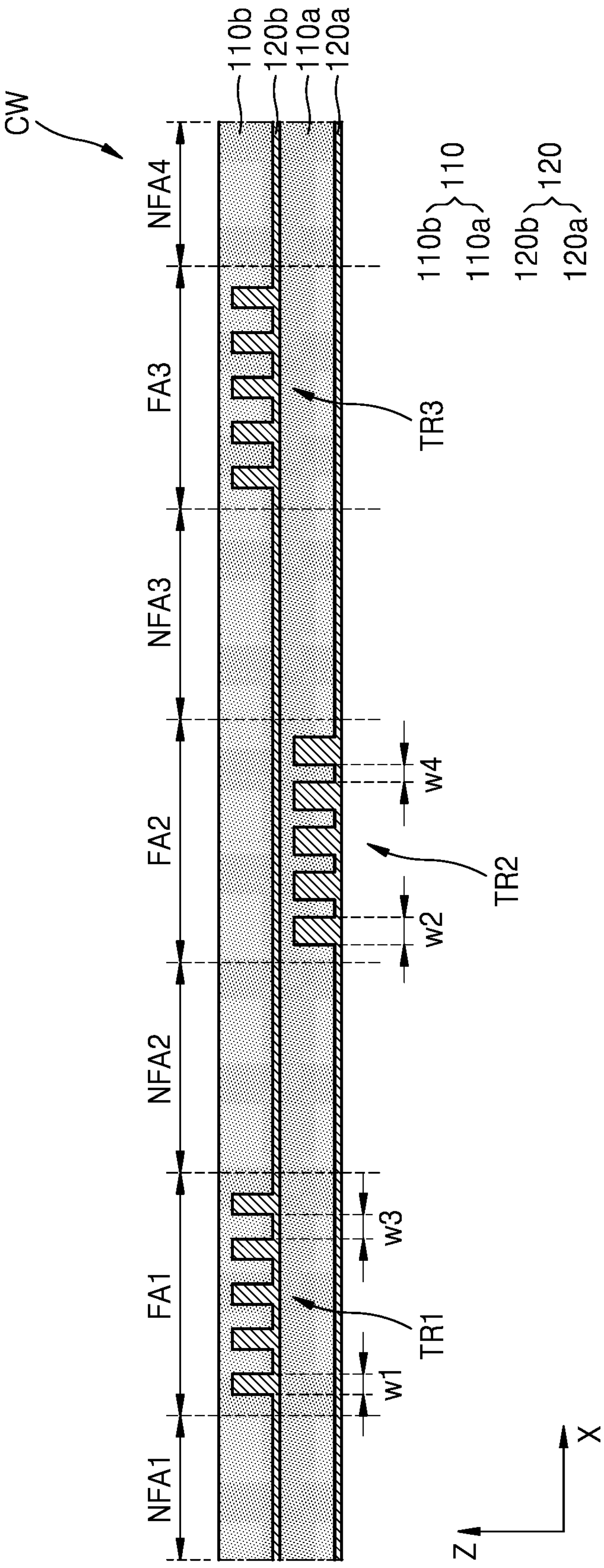
FIG. 14 is a cross-sectional view schematically illustrating a cover window according to an embodiment.
Figure 15:
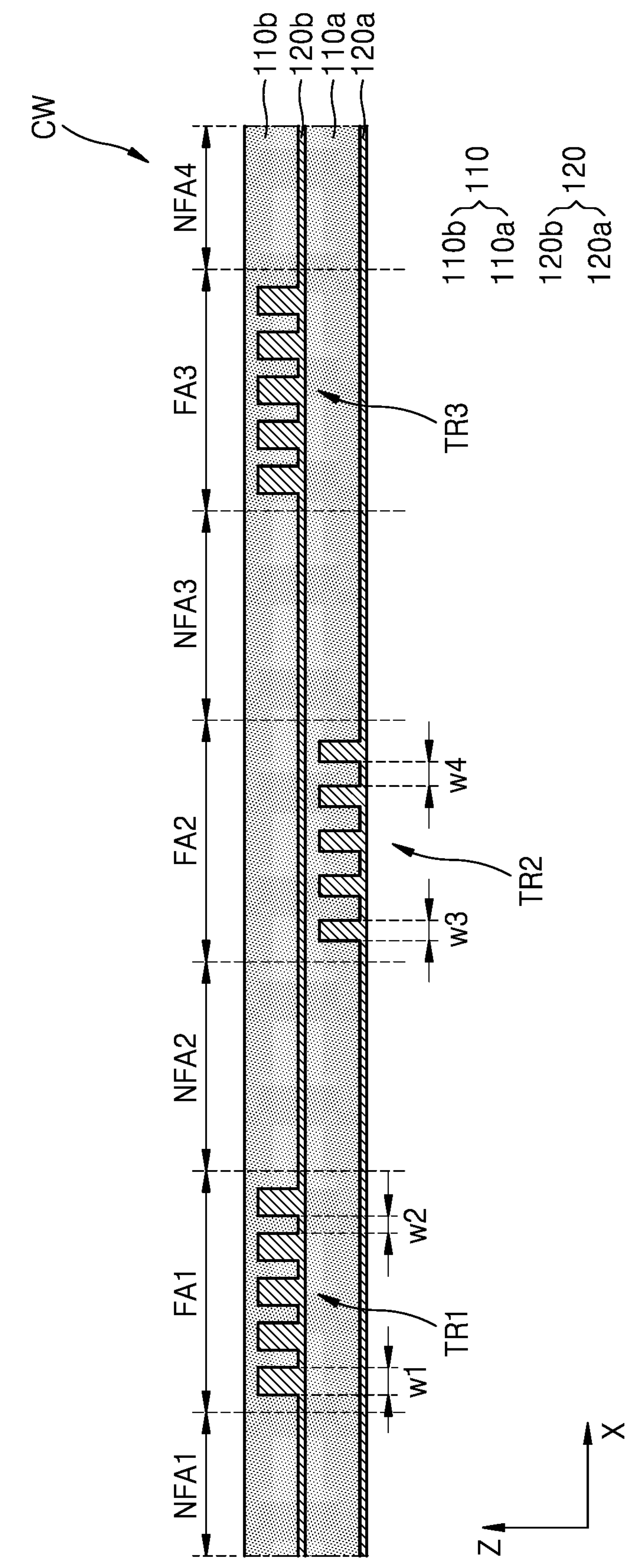
FIG. 15 is a cross-sectional view schematically illustrating a cover window according to an embodiment.

FIGS. 13, 14, and 15 are cross-sectional views schematically illustrating a cover window according to an embodiment. The embodiment of FIGS. 13, 14, and 15 may be different from the embodiment of FIGS. 10, 11, and 12 in that each of a cover layer 110 and a resin layer 120 are provided as a plurality of layers. In FIGS. 13, 14, and 15, like reference numerals as those in FIGS. 10, 11, and 12 will denote like members, and thus, redundant descriptions thereof will be omitted for conciseness.

Referring to FIGS. 13, 14, and 15, in an embodiment, a display apparatus may include a display panel and a cover window CW. For convenience of description, FIGS. 13, 14, and 15 schematically illustrate only the cover window CW of the display apparatus.

In an embodiment, the cover layer 110 may include a first cover layer 110*a* and a second cover layer 110*b*, and the resin layer 120 may include a first resin layer 120*a* and a second resin layer 120*b*.

In an embodiment, the second resin layer 120*b* may be arranged over the first resin layer 120*a*, the first cover layer 110*a* may be arranged between the first resin layer 120*a* and the second resin layer 120*b*, and the second cover layer 110*b* may be arranged over the second resin layer 120*b*. However, the disclosure is not limited thereto.

In an embodiment, the cover layer 110 may include a first non-folding area NFA1, a second non-folding area NFA2, a third non-folding area NFA3, a fourth non-folding area NFA4, a first folding area FA1, a second folding area FA2, and a third folding area FA3. The first folding area FA1 may be located between the first non-folding area NFA1 and the second non-folding area NFA2, the second folding area FA2 may be located between the second non-folding area NFA2 and the third non-folding areas NFA3, and the third folding area FA3 may be located between the third non-folding area NFA3 and the fourth non-folding area NFA4. However, the disclosure is not limited thereto.

Alternatively, in an embodiment, it may be understood that the cover window CW includes the first non-folding area NFA1, the second non-folding area NFA2, the third non-folding area NFA3, the fourth non-folding area NFA4, the first folding area FA1, the second folding area FA2, and the third folding area FA3 or the first non-folding area NFA1, the second non-folding area NFA2, the third non-folding area NFA3, the fourth non-folding area NFA4, the first folding area FA1, the second folding area FA2, and the third folding area FA3 are defined in the cover window CW.

In an embodiment, the cover layer 110 may include trenches TR1, TR2, and TR3. For example, first trenches TR1, second trenches TR2, and third trenches TR3 may be formed in the cover layer 110. In an embodiment, the resin layer 120 may fill (or charge) the trenches TR formed in the cover layer 110.

In an embodiment, each of the first trenches TR1, the second trenches TR2, and the third trenches TR3 may be located in the first cover layer 110*a* or may be located in the second cover layer 110*b*.

In an embodiment, the first trenches TR1 and the third trenches TR3 may be located in the second cover layer 110*b*, and the second trenches TR2 may be located in the first cover layer 110*a*. In an embodiment, the second resin layer 120*b* may fill (or charge) the first trenches TR1 and the third trenches TR3 formed in the second cover layer 110*b*, and the first resin layer 120*a* may fill (or charge) the second trenches TR2 formed in the first cover layer 110*a*. However, the disclosure is not limited thereto.

In an embodiment, as illustrated in FIG. 13, a width w1 of the first trench TR1 may be equal to a width w2 of the second trench TR2, and a width w3 between the first trenches TR1 adjacent to each other may be equal to a width w4 between the second trenches TR2 adjacent to each other. However, the disclosure is not limited thereto.

In an embodiment, as illustrated in FIG. 14, the width w1 of the first trench TR1 may be less than the width w2 of the second trench TR2, and the width w3 between the first trenches TR1 adjacent to each other may be greater than the width w4 between the second trenches TR2 adjacent to each other. However, the disclosure is not limited thereto.

In an embodiment, as illustrated in FIG. 15, the width w1 of the first trench TR1 may be greater than the width w2 of the second trench TR2, and the width w3 between the first trenches TR1 adjacent to each other may be less than the width w4 between the second trenches TR2 adjacent to each other. However, the disclosure is not limited thereto.

Figure 16:
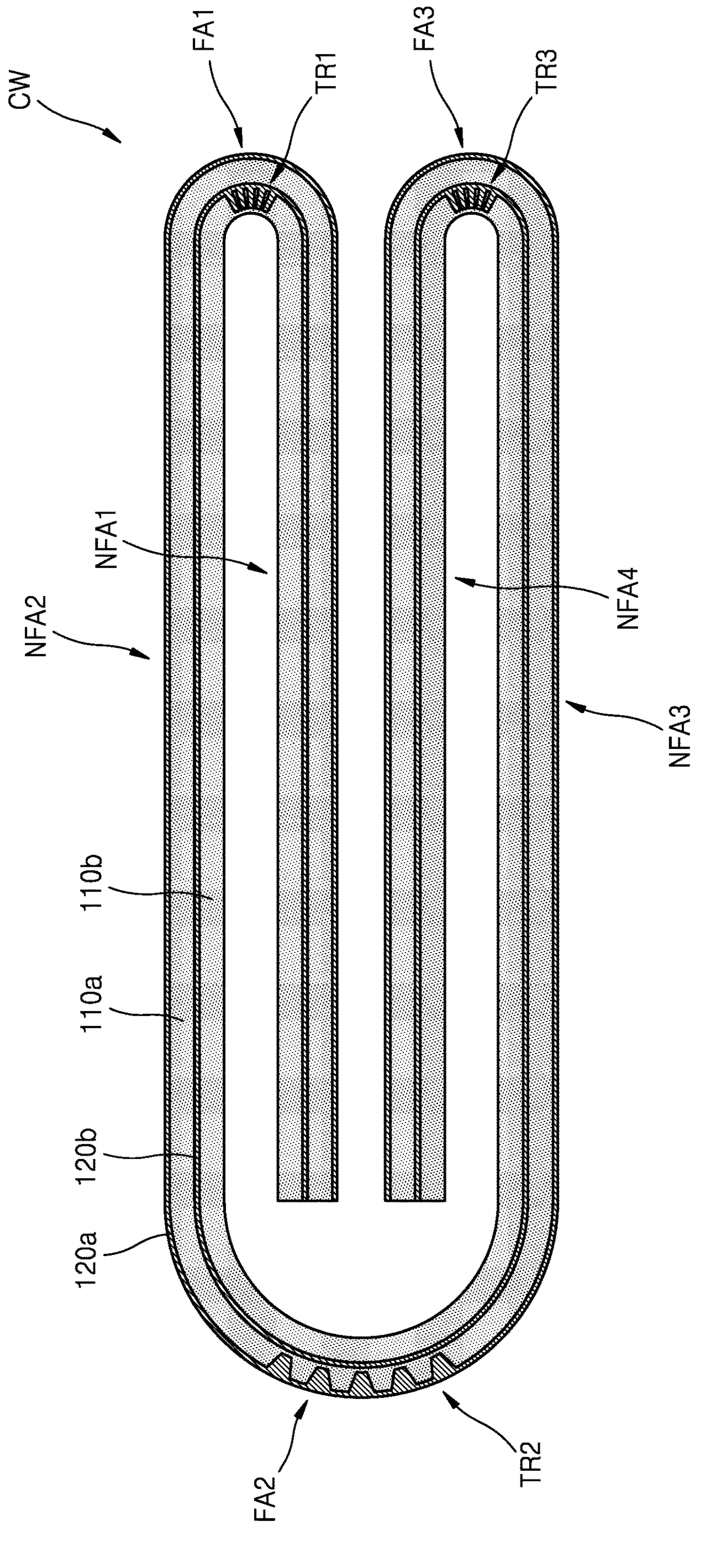
FIG. 16 is a cross-sectional view schematically illustrating a cover window according to an embodiment.

FIG. 16 is a cross-sectional view schematically illustrating a cover window according to an embodiment. FIG. 16 illustrates a state in which a cover window CW is folded. In FIG. 16, like reference numerals as those in FIGS. 13, 14, and 15 will denote like members, and thus, redundant descriptions thereof will be omitted for conciseness.

Referring to FIG. 16, when the cover layer 110 and/or the cover window CW includes a plurality of folding areas, the cover layer 110 and/or the cover window CW may be folded a plurality of times. For example, when the cover layer 110 and/or the cover window CW includes a plurality of folding areas, the cover window CW capable of multi-folding may be implemented. For example, as described above, a portion of the cover layer 110 and/or the cover window CW may be in-folded, and another portion of the cover layer 110 and/or the cover window CW may be out-folded.

Also, in an embodiment, because the cover layer 110 is provided as a plurality of layers, the folding characteristics of the cover window CW including the cover layer 110 provided as a plurality of layers may be improved.

EXAMPLES

A resin layer 120 was formed by preparing a resin composition having a composition illustrated in Table 1 with 1 wt % of the photoinitator bis(2,4,6-trimethylbenzoyl)-phenyl phosphineoxide, applying the resin composition to a glass substrate, forming a coating to a thickness of 200 micrometers (μm) by using a bar coater and a release film, and curing the same by applying an energy of about 1000 millijoules (mJ) to about 2000 mJ at about 365 nanometers (nm) to about 389 nm. The optical characteristics, mechanical characteristics, and folding characteristics of the resin layer 120 were evaluated.

TABLE 1

| | Acrylate monomer (wt %) | | | | | | | | | Crosslinker (wt %) | |
|---|---|---|---|---|---|---|---|---|---|---|---|
| | AA | BA | LA | 2-EHA | EA | HA | 4-HBA | BZA | 2-PEA | HDDA | EG DA |
| Comp. Ex. 1 | 20 | 80 | | | | | | | | | 30 |
| Comp. Ex. 2 | 25 | | 75 | | | | | | | 20 | |
| Comp. Ex. 3 | | | | 60 | | | 30 | 10 | | 10 | |
| Comp. Ex. 4 | | | | 55 | 35 | | | | 10 | | 41 |
| Comp. Ex. 5 | | | | | | 10 | | 90 | | 10 | |
| Comp. Ex. 6 | | | | 10 | | | | | 90 | | 9 |
| Ex. 1 | | | | 55 | | 10 | | 35 | | 20 | |
| Ex. 2 | | | | 30 | | 25 | | 45 | | | 20 |
| Ex. 3 | | | | 20 | 35 | | | | 45 | 10 | |
| Ex. 4 | | | | 40 | | 25 | | | 35 | | 20 |
| Ex. 5 | | | | 40 | | 10 | 10 | | 40 | | 10 |

In Table 1, AA is acrylic acid, BA is butyl acrylate, LA is lauryl acrylate, 2-EHA is 2-ethylhexyl acrylate, EA is ethyl acrylate, HA is hexyl acrylate, 4-HBA is 4-hydroxybutyl acrylate, BZA is benzyl acrylate, and 2-PEA is 2-phenoxyethyl acrylate. Also, HDDA is 1,6-hexanediol diacrylate, and EGDA is ethylene glycol diacrylate.

In each of Comparative Example 1, Comparative Example 2, Example 1, Example 2, Example 3, Example 4, and Example 5, an acrylate monomer was added such that the total amount of the acrylate monomer became 100 wt %. Also, in Table 1, the content of HDDA and EGDA represents the amount added with respect to (or based on) 100 wt % of the acrylate monomer. Also, bis(2,4,6-trimethylbenzoyl)-phenyl phosphineoxide was added as a photoinitiator, and the photoinitiator was present in 1 wt % (or 1 part) with respect to (or based on) 100 wt % (or 100 parts) of the acrylate monomer.

In Table 1, Comparative Example 1 and Comparative Example 2 correspond to a case where the (meth)acrylate copolymer included in the resin layer 120 does not include a repeat unit with an aromatic group, Comparative Example 3 and Comparative Example 4 correspond to a case where the (meth)acrylate copolymer included in the resin layer 120 includes a repeat unit with an aromatic group but the content of the monomeric repeat in the (meth)acrylate copolymer is less than 20 wt %, and Comparative Example 5 and Comparative Example 6 correspond to a case where the (meth) acrylate copolymer included in the resin layer 120 includes an aromatic group, but the content of the repeat unit with the aromatic group included in the (meth)acrylate copolymer is greater than 80 wt %. Also, Example 1 to Example 5 correspond to a case where the (meth)acrylate copolymer included in the resin layer 120 includes a repeat unit including an aromatic group within a range of about 20 wt % to about 80 wt %.

TABLE 2

| | Refractive index (589 nm) | Refractive index Difference | Abbe No | Visibility |
|---|---|---|---|---|
| Comp. Ex. 1 | 1.446 | 0.057 | 38.1 | X |
| Comp. Ex. 2 | 1.465 | 0.041 | 36.7 | X |
| Comp. Ex. 3 | 1.474 | 0.031 | 39.3 | X |
| Comp, Ex. 4 | 1.461 | 0.042 | 38.2 | X |

TABLE 2-continued

| | Refractive index (589 nm) | Refractive index Difference | Abbe No | Visibility |
|---|---|---|---|---|
| Comp. Ex. 5 | 1.577 | 0.074 | 48.9 | X |
| Comp. Ex. 6 | 1.552 | 0.063 | 46.3 | X |
| Ex. 1 | 1.511 | 0.008 | 41.3 | ○ |
| Ex. 2 | 1.518 | 0.015 | 42.6 | ○ |
| Ex. 3 | 1.513 | 0.010 | 44.8 | ○ |
| Ex. 4 | 1.508 | 0.005 | 42.1 | ◎ |
| Ex. 5 | 1.503 | 0.000 | 43.7 | ◎ |

Table 2 illustrates the result of evaluating the optical characteristics of the manufactured resin layer 120. In Table 2, the refractive index represents the refractive index for a wavelength of 589 nm, and the refractive index difference represents the absolute value of the difference between the refractive index of the cover layer 110 including ultra-thin glass and the refractive index of the resin layer 120. In this case, the refractive index of the cover layer 110 for a wavelength of 589 nm is 1.503.

Also, in Table 2, the Abbe number (Abbe No) is an index of optical dispersion, and the light dispersibility decreases as the Abbe number increases. Because the degree of light dispersion according to wavelength decreases as the Abbe number increases, an object or image may be clearly seen with little or no distortion. In this case, the Abbe number is calculated in accordance with the following Equation.

$$Abbe\ \text{No.} = \left[\frac{n_D - 1}{n_F - n_C}\right]$$

In Equation, $n_D$ represents a refractive index at a wavelength of 589 nm, $n_F$ represents a refractive index at a wavelength of 486 nm, and $n_C$ represents a refractive index at a wavelength of 659 nm.

As a method of measuring the visibility, an evaluation was determined as to whether the trenches TR were visually recognizable after the trenches TR was filled with the resin layer 120 including the resin composition. In this case, a case where the trenches TR were visually recognizable was denoted by X, a case where the trenches TR were not visually recognizable with the naked eye, but were visually recognizable on the LED light was denoted by ○, and a case where the trenches TR were not visually recognizable with the naked eye and the LED light was denoted by ◎.

Referring to Table 2, with reference to Comparative Example 1 to Comparative Example 4, it may be seen that the refractive index of the resin layer 120 is lower than the refractive index of the cover layer 110 when the (meth) acrylate copolymer included in the resin layer 120 does not include an aromatic group or the content of the aromatic group included in the (meth)acrylate copolymer is less than 20 wt %. Particularly, it may be seen that the difference between the refractive index of Comparative Example 1 to Comparative Example 4 and the refractive index of the cover layer 110 is 0.031 or more.

Also, with reference to Comparative Example 5 and Comparative Example 6, It may be seen that the refractive index of the resin layer 120 is greater than the refractive index of the cover layer 110 when the content of a repeat unit with an aromatic group in the (meth)acrylate copolymer included in the resin layer 120 is greater than 80 wt %. Particularly, it may be seen that the difference between the refractive index of Comparative Example 5 and Comparative Example 6 and the refractive index of the cover layer 110 is 0.063 or more.

It may be seen that the refractive index of Example 1 to Example 5 is more similar to the refractive index of the cover layer 110 than the refractive index of Comparative Example 1 to Comparative Example 6. Accordingly, it may be seen that the absolute value of the difference between the refractive index of the resin layer 120 and the refractive index of the cover layer 110 decreases when the (meth) acrylate copolymer included in the resin layer 120 includes a first repeat unit with an aromatic group and the content of the first repeat unit included in the (meth)acrylate copolymer is about 20 wt % to about 80 wt %. Particularly, it may be seen that the refractive index of the resin layer 120 according to Example 5 has the same value as the refractive index of the cover layer 110.

Thus, it may be seen that the absolute value of the difference between the refractive index of the resin layer 120 and the refractive index of the cover layer 110 decreases and thus the visibility of the cover window CW including these layers is improved as the (meth)acrylate copolymer included in the resin layer 120 includes a first repeat unit with an aromatic group and the content of the first repeat unit included in the (meth)acrylate copolymer is about 20 wt % to about 80 wt %.

As indicated, the Abbe number of the resin layer 120 according to Example 1 to Example 5 is greater than the Abbe number of the resin layer 120 according to Comparative Example 1 and Comparative Example 2. Thus, it may be seen that the color visibility of the resin layer 120 is excellent and the display quality thereof is excellent, when the (meth)acrylate copolymer included in the resin layer 120 includes an aromatic group.

TABLE 3

| | Modulus (MPa) | | | Glass transition temp. | Elongation | Adhesion | Folding |
|---|---|---|---|---|---|---|---|
| | −20° C. | 25° C. | 60° C. | (° C.) | (%) | (gf/inch) | character |
| Comp. Ex. 1 | 9.91 | 0.09 | 0.04 | −5 | <200 | 850 | Fail |
| Comp. Ex. 2 | 1.57 | 0.05 | 0.03 | −17 | <200 | 950 | Fail |
| Comp. Ex. 3 | 0.11 | 0.05 | 0.05 | −37 | <200 | 980 | Fail |
| Comp. Ex. 4 | 3.46 | 2.47 | 2.52 | −15 | <200 | 770 | Fail |
| Comp. Ex. 5 | 11.55 | 8.46 | 7.17 | 41 | <100 | 840 | Fail |
| Comp. Ex. 6 | 9.47 | 7.31 | 4.67 | 24 | <120 | 850 | Fail |
| Ex. 1 | 0.68 | 0.03 | 0.03 | −23 | >210 | 1070 | pass |
| Ex. 2 | 0.38 | 0.05 | 0.06 | −26 | >220 | 1030 | pass |
| Ex. 3 | 0.27 | 0.02 | 0.01 | −28 | >210 | 1080 | pass |
| Ex. 4 | 0.22 | 0.02 | 0.02 | −29 | >250 | 1090 | pass |
| Ex. 5 | 0.14 | 0.02 | 0.02 | −33 | >250 | 1230 | pass |

Table 3 illustrates the result of evaluating the mechanical characteristics and folding characteristics of the manufactured resin layer 120.

As for the modulus, the storage modulus of the resin layer 120 was measured at 35° C. under the condition of 120° C. Ramping Rate 5° C./min, Force 0.3N, Shear Strain 0.1%, and Frequency 1 Hz by using a rheometer. In this case, the modulus was measured under the condition that the thickness of a sample of the resin was 600 μm and the plate size was 8 mm.

As for the elongation, the elongation from the time of measurement to the time of fracture was measured at a speed of 50 millimeters per minute (mm/min) by using UTM Tensile Model. In this case, the percent elongation was measured under the condition that the thickness of a sample of the resin was 200 μm and the plate size was 2.5 cm×5 cm.

The adhesion was measured by 180° Peel Test. Particularly, the adhesion was measured by applying the resin layer 120 to glass, laminating and curing the same with a backing film, and peeling off the backing film. In this case, the peel-off speed was performed at a speed of 300 mm/min.

It may be seen that the modulus of Comparative Example 1, Comparative Example 4, Comparative Example 5, and Comparative Example 6 is greater than the modulus of Example 1 to Example 5 at −20° C. and 25° C. When the modulus of the resin layer 120 increases the folding characteristics of the cover window CW including the resin layer 120 may be degraded, the cover window CW including the resin layer 120 of Example 1 to Example 5 may have improved folding characteristics than the cover window CW including the resin layer 120 of Comparative Example 1, Comparative Example 4, Comparative Example 5, and/or Comparative Example 6.

It may be seen that the glass transition temperature Tg of Comparative Example 1, Comparative Example 2, Comparative Example 5, and Comparative Example 6 is higher than the glass transition temperature Tg of Example 1 to Example 5. The polymer compounds in the resin layer 120 may become hard at a temperature lower than the glass transition temperature Tg, and thus, the modulus of the resin layer 120 may increase at a temperature lower than the glass transition temperature Tg, and which may lead to the folding characteristics of the cover window CW including the resin layer 120 being degraded. Thus, Example 1 to Example 5 may have fluidity at a lower temperature than Comparative Example 1, Comparative Example 2, Comparative Example 5, and Comparative Example 6, the increase of the modulus may be prevented, and simultaneously, the folding characteristics of the cover window CW including the resin layer 120 may be improved.

It may be seen that the elongations of Comparative Example 1 to Comparative Example 6 are less than 200% and particularly, the elongations of Comparative Example 5 and Comparative Example 6 are less than 100% and 120% respectively. On the other hand, it may be seen that all of the elongations of Example 1 to Example 5 are 210% or more, and particularly, the elongations of Example 4 and Example 5 are 250% or more. When the elongation of the resin layer 120 is low, the folding characteristics of the cover window CW including the resin layer 120 may be degraded. Thus, when the resin layer 120 includes a (meth)acrylate copolymer and the (meth)acrylate copolymer includes a first repeat unit with an aromatic group in the range of about 20 wt % to about 80 wt %, the elongation of the resin layer 120 may increase and the folding characteristics of the cover window CW including the resin layer 120 may be improved.

It may be seen that the adhesion of Comparative Example 1 to Comparative Example 6 is less than the adhesion of Example 1 to Example 5. When the resin layer 120 has low adhesion, the resin layer 120 may be delaminated from the cover layer 110. Thus, when the resin layer 120 includes a (meth)acrylate copolymer and the (meth)acrylate copolymer includes a repeat unit with an aromatic group in the range of about 20 wt % to about 80 wt %, the delamination of the resin layer 120 from the cover layer 110) may be prevented or minimized.

The resin layer 120 according to Comparative Example 1 to Comparative Example 6 and Example 1 to Example 5 was formed on the cover layer 110 including the trenches TR, and then a folding test was performed at −20° C. with a curvature of 1.5R. In this case, after the folding test was performed 100,000 or more times, if the cover window CW was degraded or damaged, the cover window CW was evaluated as Fail, and if there is no observable damage or change in the cover window CW, it was evaluated as Pass.

As illustrated in Table 3, in the case of the cover window CW including the resin layer 120 according to Comparative Example 1 to Comparative Example 6, it may be seen that the evaluation criterion (e.g., 100,000 or more times) is not satisfied. On the other hand, in the case of the cover window CW including the resin layer 120 according to Example 1 to Example 5, it may be seen that the evaluation criterion (e.g., 100,000 or more times) is satisfied. Also, in the case of the cover window CW including the resin layer 120 according to Example 4, even when the cover window CW was folded 150,000 or more times, the cover window CW showed substantially no damage. Also, in the case of the cover window CW including the resin layer 120 according to Example 5, even when the cover window CW was folded 200,000 or more times, the cover window CW showed substantially no damage. Thus, it may be seen that the folding characteristics of the resin layer 120 and the cover window CW including the resin layer 120 are improved when the resin layer 120 includes a (meth)acrylate copolymer and the (meth)acrylate copolymer includes a first repeat unit with an aromatic group in the range of about 20 wt % to about 80 wt %.

The cover window CW may include the cover layer 110 including ultra-thin glass. When the thickness of the cover layer 110 including ultra-thin glass is too small, the impact resistance characteristics of the cover window CW may be degraded. However, when the thickness of the cover layer 110 including ultra-thin glass is too large, the folding characteristics of the cover window CW may be degraded.

Thus, the thickness of the cover layer 110 including ultra-thin glass may be increased such that the cover window CW including the cover layer 110 including ultra-thin glass may have an impact resistance of a suitable level or more. Also, simultaneously, trenches TR may be formed in the folding area FA of the cover layer 110 such that the cover window CW including the cover layer 110 including ultra-thin glass may have folding characteristics of a suitable level or more.

The trenches TR formed in the folding area FA of the cover layer 110 may be visually seen or recognized; however, when the refractive index of the resin layer 120 within or filling the trenches TR is similar to the refractive index of the cover layer 110 including ultra-thin glass, the visibility of the trenches TR formed in the folding area FA of the cover layer 110 may be prevented or minimized.

In an embodiment, the resin layer 120 may be provided (or formed) as a resin composition including a (meth) acrylate copolymer, and the (meth)acrylate copolymer may be provided (or formed) as a first repeat unit derived from a first monomer including an aromatic. However, as the content of the aromatic increases, the modulus and the glass transition temperature of the resin layer 120 including the aromatic may increase and thus the folding characteristics of the cover window CW including the resin layer 120 may be degraded.

Thus, because the resin layer 120 is provided (or formed from) a resin composition including a (meth)acrylate copolymer and the (meth)acrylate copolymer includes a content (e.g., about 20 wt % to about 80 wt %) of first repeat unit derived from a first monomer including an aromatic group, the refractive index of the resin layer 120 may be similar to the refractive index of the cover layer 110 including ultra-thin glass, and thus, the visibility of the trenches TR formed in the folding area FA of the cover layer 110 may be non-existent or minimized. In this case, the absolute value of the difference between the refractive index of the resin layer 120 and the refractive index of the cover layer 110 may be 0.03 or less with respect to the same wavelength (e.g., 589 nm wavelength), or may be, for example, 0.02 or less, or, 0.005 or less, with respect to the same wavelength (e.g., 589 nm wavelength).

Also, because the resin layer 120 has a modulus of about 0.1 MPa to about 1.0 MPa at −20° C. or has a modulus of, for example, about 0.1 MPa to about 0.3 MPa, the folding characteristics of the cover window CW including the resin layer 120 may be improved.

Because the glass transition temperature Tg of the resin layer 120 is −20° C. or less or is, for example, −25° C. or less, the increase of the modulus of the resin layer 120 may be prevented or minimized and simultaneously the folding characteristics of the cover window CW including the resin layer 120 may be improved. The Tg of the resin layer may be measured by using a rheometer.

Thus, because the resin layer 120 is provided (or formed from) a resin composition including a (meth)acrylate copolymer and the (meth)acrylate copolymer includes a content (e.g., about 20 wt % to about 80 wt %) of a first repeat unit derived from a first monomer including an aromatic group, the refractive index of the resin layer 120 may be similar to the refractive index of the cover layer 110 including ultra-thin glass, and the modulus and the glass transition temperature Tg of the resin layer 120 may be adjusted to a suitable level, and thus, the folding characteristics of the cover window CW including the resin layer 120 may be improved.

According to an embodiment described above, a cover window having impact resistance and flexibility, and therefore, a display apparatus including the cover window, may be implemented. However, the scope of the disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A cover window comprising:

a cover layer including a first non-folding area, a second non-folding area, and a folding area that includes trenches; and a resin layer arranged under the cover layer and within the trenches of the folding area, wherein the resin layer includes a resin composition including a (meth)acrylate copolymer, and a content of a first repeat unit derived from a first monomer represented by Formula 1 in the (meth) acrylate copolymer is about 20 weight percent to about 55 weight percent with respect to a 100 weight percent of monomeric units present in the (meth)acrylate copolymer, Formula 1

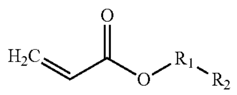

where $R_1$ is a $C_1$ to $C_6$ alkylene group, a $C_1$ to $C_6$ alkylene group with one or more oxygen atoms, or an aromatic group, $R_2$ is a $C_1$ to $C_6$ alkyl group, a $C_1$ to $C_6$ alkyl group with one or more oxygen atoms, or an aromatic group, and at least one of $R_1$ or $R_2$ includes an aromatic group.

2. The cover window of claim 1, wherein $R_1$ includes an optionally substituted phenylene or $R_2$ includes an optionally substituted phenyl group.

3. The cover window of claim 1, wherein a content of a second repeat unit derived from a second monomer represented by Formula 2 in the (meth)acrylate copolymer is about 20 weight percent to about 80 weight percent with respect to the 100 weight percent of the monomeric units present in the (meth)acrylate copolymer, Formula 2

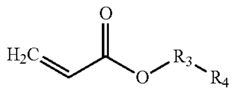

where $R_3$ is a $C_1$ to $C_6$ alkylene group or a $C_1$ to $C_6$ alkylene group with one or more oxygen atoms, and $R_4$ is a $C_1$ to $C_6$ alkyl group or a $C_1$ to $C_6$ alkyl group with one or more oxygen atoms.

4. The cover window of claim 1, wherein the (meth) acrylate copolymer further includes a crosslinker unit.

5. The cover window of claim 4, wherein a content of the crosslinker unit is about 10 weight percent to about 40 weight percent with respect to the total weight of the monomeric units present in the (meth)acrylate copolymer.

6. The cover window of claim 5, wherein the crosslinker unit is derived from 1,6-hexanediol diacrylate, ethylene glycol diacrylate, or any combination thereof.

7. The cover window of claim 4, wherein the cover layer has a first refractive index with respect to a first wavelength, the resin layer has a second refractive index with respect to the first wavelength, and an absolute value of a difference between the first refractive index and the second refractive index is about 0.03 or less.

8. The cover window of claim 1, wherein a modulus of the resin layer at about −20° C. is about 0.1 megapascals to about 1.0 megapascals.

9. The cover window of claim 1, wherein a glass transition temperature Tg of the resin layer is about −20° C. or less.

10. The cover window of claim 1, wherein an elongation of the resin layer is about 210% or more.

11. The cover window of claim 1, wherein an adhesion of the resin layer at room temperature is about 960 grams-force per inch or more.

12. The cover window of claim 1, wherein a geometric shape of the trenches in a cross-sectional view is a tetragon, a triangle, a semicircle, or an ellipse.

13. The cover window of claim 1, wherein the trenches are located within the folding area.

14. The cover window of claim 1, wherein the folding area includes a first folding area, a second folding area, and a third folding area, and the cover layer includes first trenches, second trenches, and third trenches, wherein the first trenches are located within the first folding area, the second trenches are located within the second folding area, and the third trenches are located within the third folding area.

15. The cover window of claim 14, wherein the cover layer further includes a first cover layer and a second cover layer arranged over the first cover layer, and the resin layer further includes a first resin layer arranged between the first cover layer and the second cover layer and a second resin layer arranged over the second cover layer.

16. The cover window of claim 15, wherein when the first trenches are located over the second cover layer, at least one of the second trenches or the third trenches is located over the first cover layer.

17. A display apparatus comprising:

a display panel including a pixel; and a cover window including a cover layer arranged over the display panel, the cover window including a first non-folding area, a second non-folding area, and a folding area that includes trenches, and a resin layer arranged under the cover layer and within the trenches of the folding area, wherein the resin layer includes a (meth)acrylate copolymer, and a content of a first repeat unit derived from a first monomer represented by Formula 1 in the (meth) acrylate copolymer is about 20 weight percent to about 55 weight percent with respect to 100 weight percent of monomeric units present in the (meth)acrylate copolymer, Formula 1

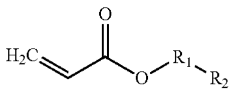

where $R_1$ is a $C_1$ to $C_6$ alkylene group, a $C_1$ to $C_6$ alkylene group with one or more oxygen atoms, or an aromatic group, $R_2$ is a $C_1$ to $C_6$ alkyl group, a $C_1$ to $C_6$ alkyl group with one or more oxygen atoms, or an aromatic group, and at least one of $R_1$ or $R_2$ includes an aromatic group.

18. The display apparatus of claim 17, wherein $R_1$ includes an optionally substituted phenyl or phenylene, or $R_2$ includes an optionally substituted phenyl group.

19. The display apparatus of claim 17, wherein a content of a second repeat unit derived from a second monomer represented by Formula 2 in the (meth)acrylate copolymer is about 20 wt % to about 80 wt % with respect to 100 weight percent of monomeric units in the (meth)acrylate copolymer, Formula 2

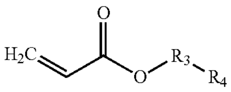

where $R_3$ is a $C_1$ to $C_6$ alkylene group or $C_1$ to $C_6$ alkylene group with one or more oxygen atoms, and $R_4$ is a $C_1$ to $C_6$ alkyl group or a $C_1$ to $C_6$ alkyl group with one or more oxygen atoms.

20. The display apparatus of claim 17, wherein the resin further includes a crosslinker unit.

21. The display apparatus of claim 20, wherein a content of the crosslinker unit is about 10 weight percent to about 40 weight percent with respect to the total amount of the monomeric units present in (meth)acrylate copolymer.

22. The display apparatus of claim 21, wherein the crosslinker unit is derived from 1,6-hexanediol diacrylate, ethylene glycol diacrylate, or any combination thereof.

* * * * *